United States Patent
Heuer et al.

(12)

(10) Patent No.: US 6,294,273 B1
(45) Date of Patent: *Sep. 25, 2001

(54) ELECTROLUMINESCENT ASSEMBLIES CONTAINING N-ALKYL-2,2'-IMINO-BIS-(8-HYDROXY-QUINOLINE)-METAL COMPLEXES

(75) Inventors: Helmut-Werner Heuer; Rolf Wehrmann, both of Krefeld; Andreas Elschner, Mülheim, all of (DE)

(73) Assignee: Bayer Aktiengesellschaft, Leverkusen (DE)

( * ) Notice: Subject to any disclaimer, the term of this patent is extended or adjusted under 35 U.S.C. 154(b) by 0 days.

This patent is subject to a terminal disclaimer.

(21) Appl. No.: 09/327,607

(22) Filed: Jun. 8, 1999

(30) Foreign Application Priority Data

Jun. 9, 1998 (DE) .............................. 198 25 737

(51) Int. Cl.[7] .................................. H05B 33/14
(52) U.S. Cl. .......................... 428/690; 428/691; 428/704; 428/917; 313/503; 313/504; 313/506; 313/507; 313/498
(58) Field of Search .................. 428/690, 691, 428/917, 704; 313/503, 504, 506, 507, 498

(56) References Cited

U.S. PATENT DOCUMENTS 5,554,450 * 9/1996 Shi et al. ............................. 428/690
5,965,281 * 10/1999 Cao et al. ........................... 428/690

FOREIGN PATENT DOCUMENTS

WO 98/51131 * 11/1998 (JP) .

OTHER PUBLICATIONS

Bayer's Product Information (Trail Product A1 4071, Sep., 1995).*

* cited by examiner

Primary Examiner—Cynthia H. Kelly
Assistant Examiner—Ling Xu
(74) Attorney, Agent, or Firm—Joseph C. Gil; Richard E. L. Henderson

(57) ABSTRACT

Electroluminescent assembly comprising a substrate, an anode, an electroluminescent element and a cathode, where at least one of the two electrodes is transparent in the visible spectral region and the electroluminescent element contains one or more zones selected from the group consisting of hole injection zone, hole transport zone, electroluminescent zone, electron transport zone and electron injection zone in the stated order, where each of the zones present can also assume functions of the other zones mentioned, characterized in that the electroluminescent element contains an N-alkyl-2,2'-imino-bis-(8-hydroxyquinoline)-metal complex.

11 Claims, No Drawings

ELECTROLUMINESCENT ASSEMBLIES CONTAINING N-ALKYL-2,2'-IMINO-BIS-(8-HYDROXY-QUINOLINE)-METAL COMPLEXES

An electroluminescent (EL) assembly is characterized in that it emits light and a current flows when an electric potential is applied. Such assemblies have long been known in industry under the name "light emitting diodes" (LEDs). The emission of light results from the recombination of positive charges (holes) and negative charges (electrons) with emission of light.

In the development of light-emitting components for electronics or phototechnology, use is nowadays made mainly of inorganic semiconductors such as gallium arsenide. Dot-shaped display elements can be produced on the basis of such substances. Large-area assemblies are not possible.

Apart from the semiconductor light emitting diodes, electroluminescent assemblies based on vapour-deposited low molecular weight organic compounds are known (U.S. Pat. Nos. 4,539 507, 4,769 262, 5,077,142, EP-A 0 406 762, EP-A 0 278 758, EP-A 0 278 757).

Furthermore, polymers such as poly-(p-phenylenes) and poly-(p-phenylene-vinylenes) (PPV) have been described as electroluminescent polymers: G. Leising et al., Adv. Mater. 4 (1992) No. 1; Friend et al., J. Chem. Soc., Chem. Commun. 32 (1992); Saito et al., Polymer, 1990, Vol. 31, 1137; Friend et al., Physical Review B, Vol. 42, No. 18, 11670 or WO 90/13148. Further examples of PPVs in electroluminescence displays are described in EP-A 0 443 861, WO-A 92/03490 and 92/03491.

EP-A 0 294 061 discloses an optical modulator based on polyacetylene.

Heeger et al. have proposed soluble, conjugated PPV derivatives for producing flexible polymer LEDs (WO-A 92/16023).

Polymer blends of different compositions are likewise known: M. Stolka et al., Pure & Appt. Chem., Vol. 67, No. 1, pp. 175–182, 1995; H. Bässler et al., Adv. Mater. 1995, 7, No. 6, 551; K. Nagai et al., Appl. Phys. Lett. 67 (16), 1995, 2281; EP-A 0 532 798.

The organic EL assemblies generally contain one or more layers of organic charge transport compounds. The in-principle structure in order of the layers is as follows:
1 support, substrate
2 base electrode
3 hole injection layer
4 hole transport layer
5 light-emitting layer
6 electron transport layer
7 electron injection layer
8 top electrode
9 contacts
10 envelope, encapsulation.

The layers 3 to 7 represent the electroluminescent element.

This structure represents the most general case and can be simplified by leaving out individual layers so that one layer assumes a plurality of functions. In the simplest case, an EL assembly comprises two electrodes between which there is an organic layer which fulfils all functions including the emission of light. Such systems have been described, for example, in the application WO-A 90/13148 on the basis of poly-(p-phenylene-vinylene).

Multilayer systems can be constructed by vapour deposition processes in which the layers are applied in succession from the gas phase or are applied by casting processes. Owing to the greater process speeds, casting processes are preferred. However, partial dissolution of a layer which has already been applied when it is covered by the next layer can present difficulties in certain cases.

It is an object of the present invention to provide electroluminescent assemblies having a high light flux, in which novel metal complexes having improved solubility in customary solvents are to be used as emitters and/or electron conductors. It should also be possible to apply these novel metal complexes from the gas phase by vapour deposition processes.

It has been found that electroluminescent assemblies containing the metal complexes described below meet these requirements. In the following, the term zone is equivalent to the term layer.

The present invention accordingly provides an electroluminescent assembly comprising a substrate, an anode, an electroluminescent element and a cathode, where at least one of the two electrodes is transparent in the visible spectral region and the electroluminescent element contains one or more zones selected from the group consisting of hole injection zone, hole transport zone, electroluminescent zone, electron transport zone and electron injection zone in the stated order, where each of the zones present can also assume functions of the other zones mentioned, characterized in that the electroluminescent element contains an N-alkyl-2,2'-imino-bis-(8-hydroxyquinoline)-metal complex.

The hole injection zone preferably contains an uncharged or cationic polythiophene of the formula (I)

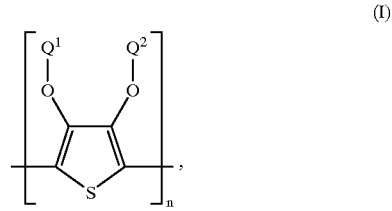

where $Q^1$ and $Q^2$ represent, independently of one another, hydrogen, substituted or unsubstituted $(C_1–C_{20})$-alkyl, $CH_2OH$ or $(C_6–C_{14})$-aryl or $Q^1$ and $Q^2$ together represent $-(CH_2)_m-CH_2-$ where m=0 to 12, preferably from 1 to 6, $(C_6–C_{14})$-arylene, and n represents an integer from 2 to 10,000, preferably from 5 to 5000.

The hole conduction zone adjoining the hole injection zone preferably contains one or more aromatic tertiary amino compounds, preferably substituted or unsubstituted triphenylamine compounds, particularly preferably 1,3,5-tris(aminophenyl)benzene compounds of the formula (II)

The zones or zone located between the hole injection zone and the cathode can also assume a plurality of functions, i.e. one zone can contain, for example, hole-injecting, hole-transporting, electroluminescent, electron-transporting and/or electron-injecting substances.

The electroluminescent element can also contain one or more transparent polymeric binders.

The substituted or unsubstituted 1,3,5-tris(aminophenyl) benzene compound preferably represents an aromatic tertiary amino compound of the general formula (II)

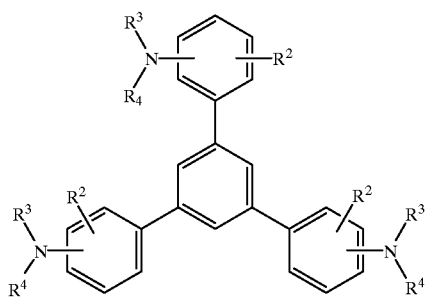

where
- $R^2$ represents hydrogen, substituted or unsubstituted alkyl or halogen,
- $R^3$ and $R^4$ represent, independently of one another, substituted or unsubstituted $(C_1-C_{10})$-alkyl, alkoxycarbonyl-substituted $(C_1-C_{10})$-alkyl, substituted or unsubstituted aryl, aralkyl or cycloalkyl,
- $R^3$ and $R^4$ preferably represent, independently of one another, $(C_1-C_6)$-alkyl, in particular methyl, ethyl, n- or iso-propyl, n-, iso-, sec- or tert-butyl, $(C_1-C_4)$-alkoxycarbonyl-$(C_1-C_6)$-alkyl, for example methoxycarbonyl-, ethoxy-carbonyl-, propoxycarbonyl-, butoxycarbonyl-$(C_1-C_4)$-alkyl, unsubstituted or $(C_1-C_4)$-alkyl- and/or $(C_1-C_4)$-alkoxy-substituted phenyl-$(C_1-C_4)$-alkyl, naphthyl-$(C_1-C_4)$-alkyl, cyclopentyl, cyclohexyl, phenyl or naphthyl.

Particularly preferably, $R^3$ and $R^4$ represent, independently of one another, unsubstituted phenyl or naphthyl or phenyl or naphthyl substituted in each case by from 1 to 3 methyl, ethyl, n- iso-propyl, methoxy, ethoxy, n- and/or iso-propoxy groups.

$R^2$ preferably represents hydrogen, $(C_1-C_6)$-alkyl such as methyl, ethyl, n- or iso-propyl, n-, iso-, sec- or tert-butyl or chlorine.

Such compounds and their preparation are described in U.S. Pat. No. 4,923,774 for use in electrophotography, which patent is hereby expressly incorporated by reference into the present description. The tris-nitrophenyl compound can, for example, be converted into the tris-aminophenyl compound by generally known catalytic hydrogenation, for example in the presence of Raney nickel (Houben-Weyl 4/1C, 14–102, Ullmann (4) 13, 135–148). The amino compound is reacted with substituted halogenobenzenes in a generally known manner.

The following compounds may be mentioned by way of example:

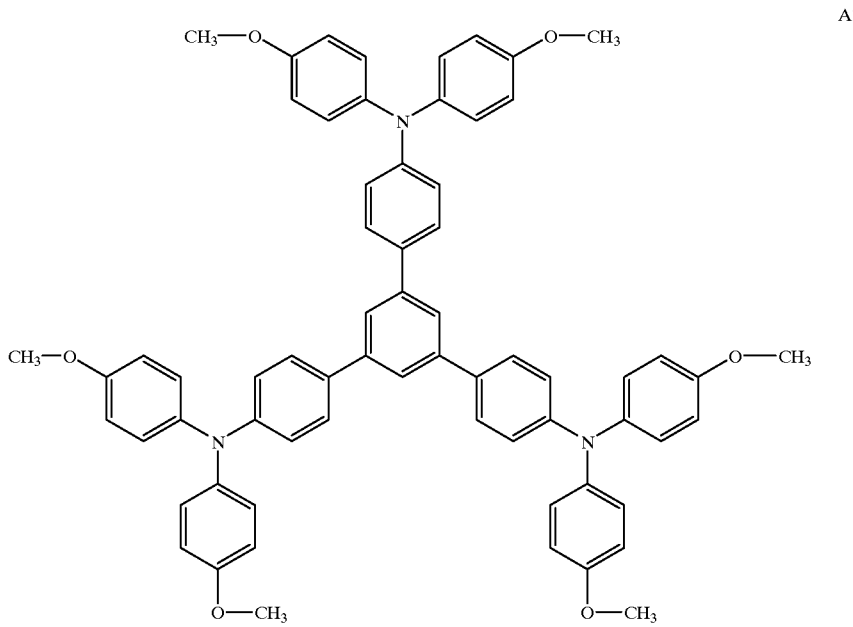

A1

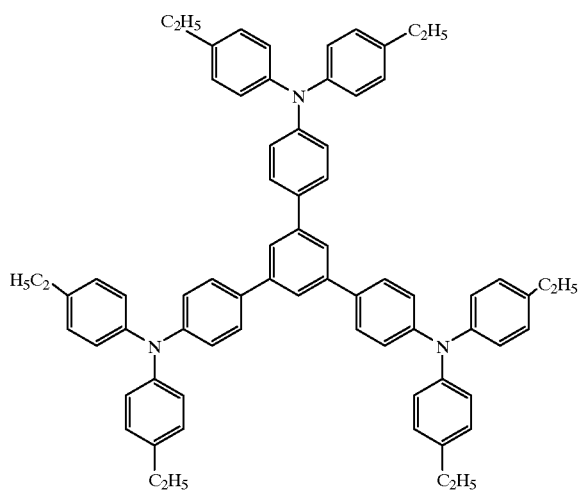

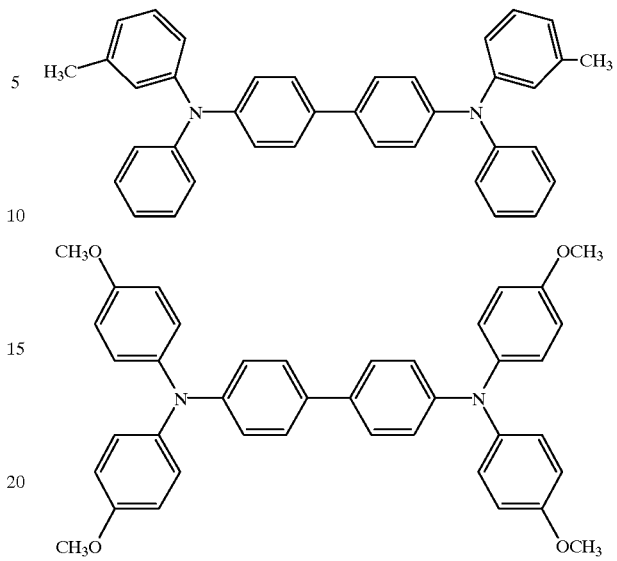

Apart from the tertiary amino compound, further hole conductors, e.g. in the form of a mixture with the tertiary amino compound, may be used for forming the electroluminescent element. These can be, on the one hand, one or more compounds of the formula (II), including mixtures of isomers, and also, on the other hand, mixtures of hole-transporting compounds with compounds of tertiary amino compounds (of the general formula (II)) having various structures.

A listing of possible hole injection and hole conductor materials is given in EP-A 0-532 798.

In the case of mixtures of the aromatic amines, compounds can be used in any ratio.

Examples which may be mentioned are:

Materials which have hole-conducting properties and can be used in pure form or in admixture with the tertiary amino compounds are, for example, the following compounds, where $X^1$ to $X^6$ represent, independently of one another, H, halogen, alkyl, aryl, alkoxy, aryloxy.

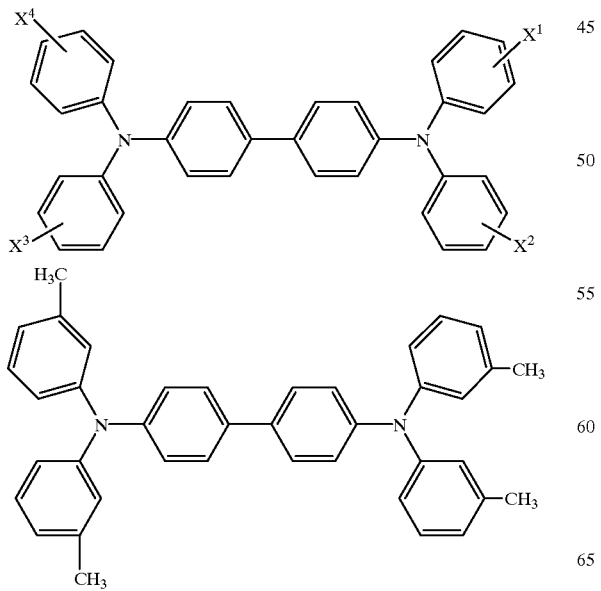

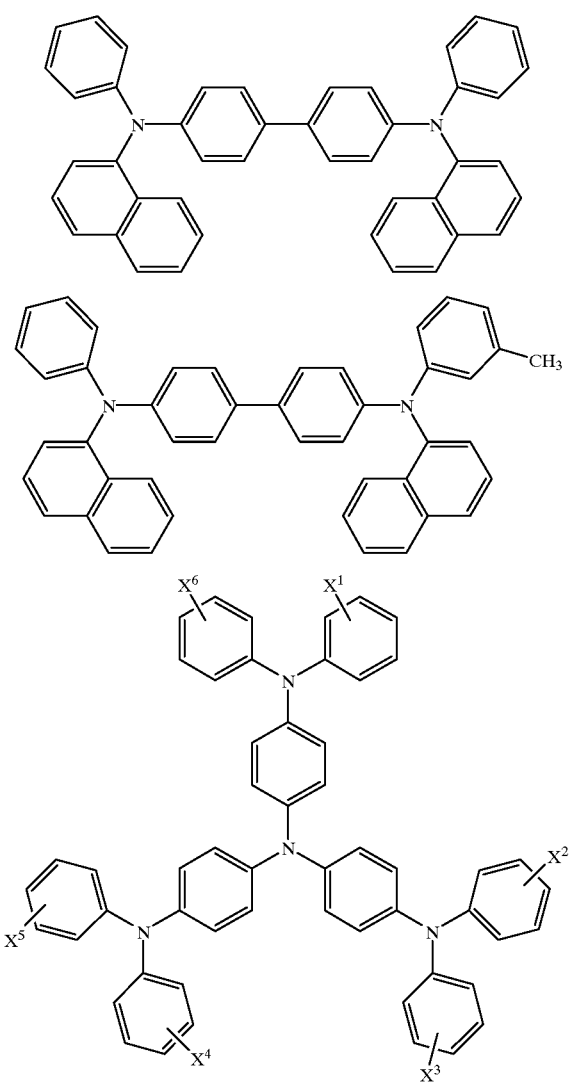

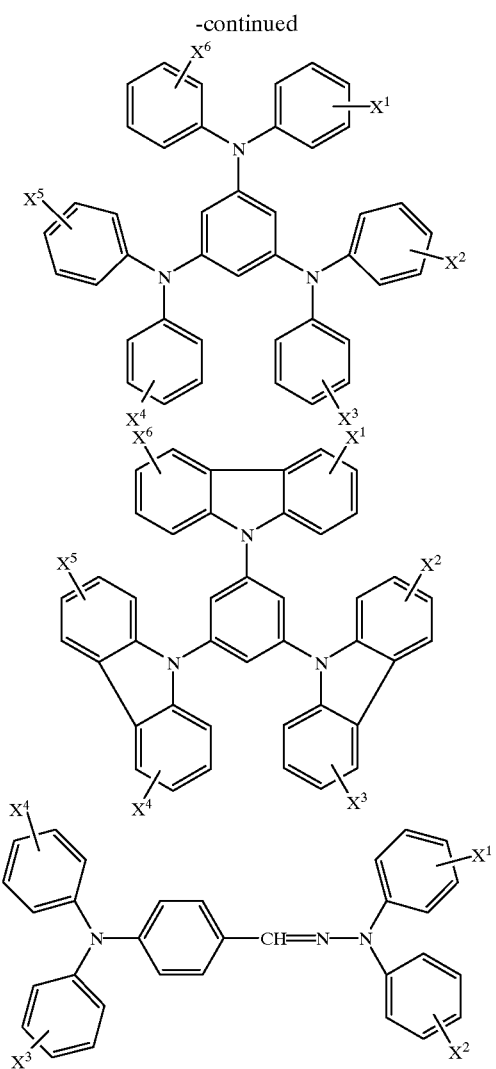
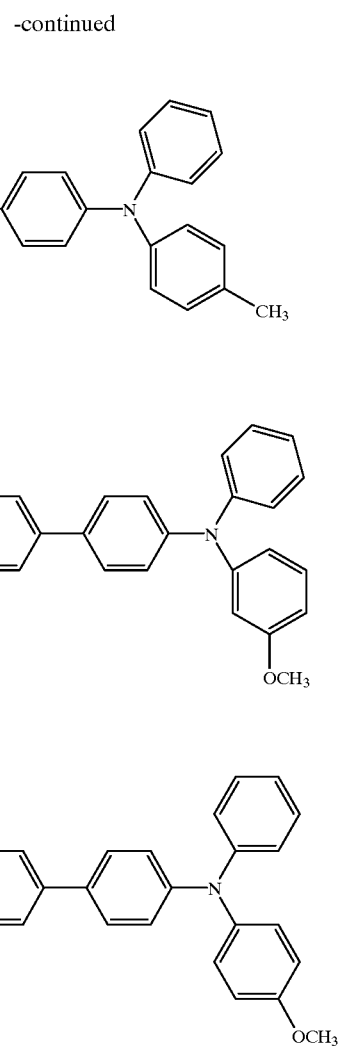
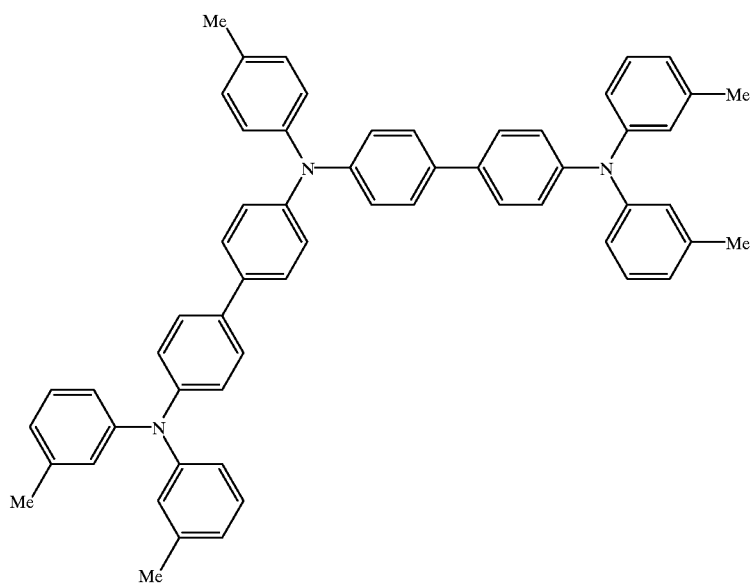

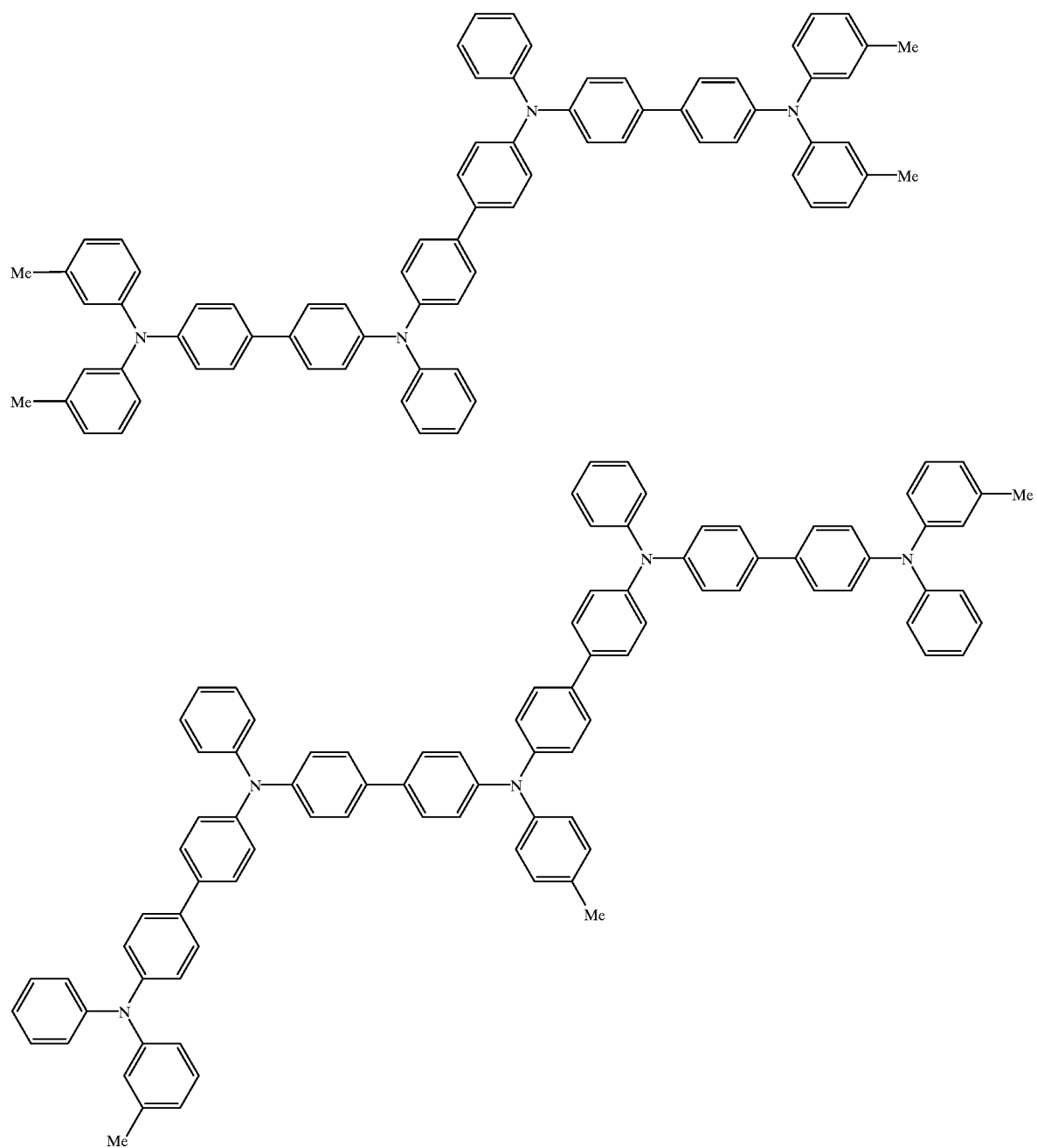
-continued

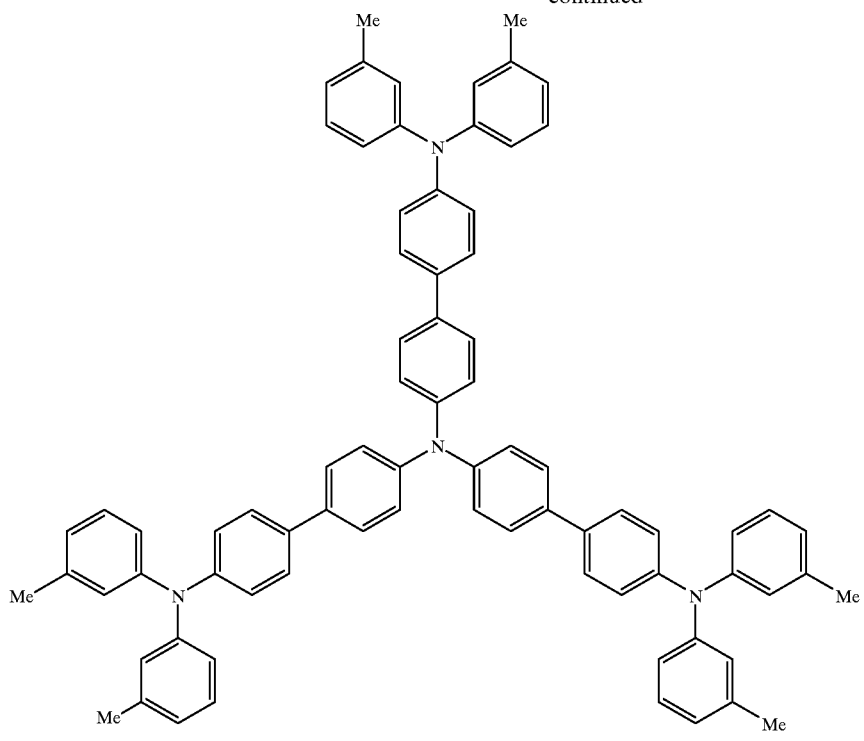

Me=methyl

These and further examples are further described in J. Phys. Chem. 1993, 97, 6240–6248 and Appl. Phys. Lett., Vol. 66, No. 20, 2679–2681.

In general, various amines having a different basic structure and/or different substitution patterns can be mixed.

$X^1$ to $X^6$ preferably represent, independently of one another, hydrogen, fluorine, chlorine, bromine, $(C_1-C_{10})$-, in particular $(C_1-C_4)$-alkyl or -alkoxy, phenyl, naphthyl, phenoxy and/or naphthyloxy. The aromatic rings can be monosubstituted, disubstituted, trisubstituted or tetrasubstituted by identical or different radicals $X^1$ to $X^6$.

The polythiophenes having the structural repeating unit of the formula (I) are known (cf. EP-A 0 440 958 and 0 339 340). The preparation of the dispersions or solutions used according to the invention is described in EP-A 0 440 957 and DE-A 42 11 459.

In the dispersion or solution, the polythiophenes are preferably used in cationic form as is obtained, for example, by treatment of the uncharged thiophenes with oxidizing agents. Customary oxidizing agents such as potassium peroxodisulphate are used for the oxidation. As a result of the oxidation, the polythiophenes acquire positive charges which are not shown in the formulae since their number and their position cannot be determined unambiguously. They can be prepared directly on supports by the methods described in EP-A 0 339 340.

$Q^1$ and $Q^2$ in formula (I) preferably represent —$(CH_2)_m$,—$CH_2$— where m=1 to 4, very particularly preferably ethylene.

Preferred cationic or uncharged polydioxythiophenes comprise structural units of the formula (Ia) or (Ib)

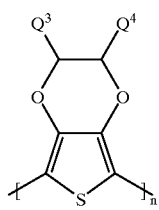
(Ia)

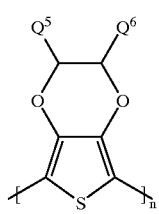
(Ib)

where
Q³ and Q⁴ represent, independently of one another, hydrogen, substituted or unsubstituted $(C_1-C_{18})$-alkyl, preferably $(C_1-C_{10})$-, in particular $(C_1-C_6)$-alkyl, $(C_2-C_{12})$-alkenyl, preferably $(C_2-C_8)$-alkenyl, $(C_3-C_7)$-cycloalkyl, preferably cyclopentyl or cyclohexyl, $(C_7-C_{15})$-aralkyl, preferably phenyl-$(C_1-C_4)$-alkyl, $(C_6-C_{10})$-aryl, preferably phenyl or naphthyl, $(C_1-C_{18})$-alkoxy, preferably $(C_1-C_{10})$-alkoxy, for example methoxy, ethoxy, n-or iso-propoxy, or $(C_2-C_{18})$-alkyloxy ester and Q⁵ and Q⁶ represent, independently of one another, hydrogen or $(C_1-C_{18})$-alkyl, preferably $(C_1-C_{10})$-, in particular $(C_1-C_6)$-alkyl, $(C_2-C_{12})$-alkenyl, preferably $(C_2-C_8)$-alkenyl, $(C_3-C_7)$-cycloalkyl, preferably cyclopentyl or cyclohexyl, ($C_7$–$C_{15}$)-aralkyl, preferably phenyl-($C_1$–$C_4$)-alkyl, ($C_6$–$C_{10}$)-aryl, preferably phenyl or naphthyl, ($C_1$–$C_{18}$)-alkoxy, preferably ($C_1$–$C_{10}$)-alkoxy, for example methoxy, ethoxy, n- or iso-propoxy, or ($C_2$–$C_{18}$)-alkyloxy ester each of which are substituted by at least one sulphonate group, where if $Q^5$ is hydrogen, $Q^6$ is not hydrogen and vice versa, n represents an integer from 2 to 10,000, preferably from 5 to 5000.

Particular preference is given to cationic or uncharged polythiophenes of the formulae (Ia-1) and (Ib-1)

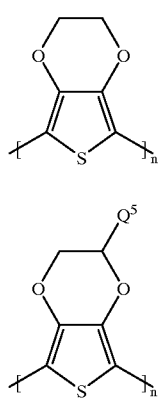

(Ia-1)

(Ib-1)

where $Q^5$ and n are as defined above.

To compensate the positive charge, the cationic form of the polythiophenes contains anions, preferably polyanions.

As polyanions, preference is given to the anions of polymeric carboxylic acids such as polyacrylic acids, polymethacrylic acids or polymaleic acids and polymeric sulphonic acids such as polystyrenesulphonic acids and polyvinylsulphonic acids. These polycarboxylic and polysulphonic acids can also be copolymers of vinylcarboxylic and vinylsulphonic acids with other polymerizable monomers such as acrylic esters and styrene.

Particular preference is given to the anion of polystyrenesulphonic acid as counterion.

The molecular weight of the polyacids which form the polyanions is preferably from 1000 to 2,000,000, particularly preferably from 2000 to 500,000. The polyacids or their alkali metal salts are commercially available, e.g. polystyrenesulphonic acids and polyacrylic acids, or else can be prepared by known methods (see, for example, Houben-Weyl, Methoden der organischen Chemie, volume E 20 Makromolekulare Stoffe, part 2 (1987), p. 1141 ff.).

In place of the free polyacids required for formation of the dispersions of polydioxythiophenes and polyanions, it is also possible to use mixtures of alkali metal salts of the polyacids and corresponding amounts of monoacids.

In the case of the formulae (Ib) and (Ib-1), the polydioxythiophenes bear positive and negative charges in the monomer unit itself.

The assemblies according to the invention may also contain, as binder, polymers and/or copolymers such as polycarbonates, polyester carbonates, copolymers of styrene such as SAN or styrene acrylates, polysulphones, polymers based on vinyl-containing monomers such as poly(meth)acrylates, polyvinylpyrrolidone, polyvinylcarbazole, vinyl acetate and vinyl alcohol polymers and copolymers, polyolefins, cyclic olefin copolymers, phenoxy resins, etc. It is also possible to use mixtures of various polymers. The polymeric binders have molecular weights of from 10,000 to 2,000,000 g/mol, are soluble and film-forming and are transparent in the visible spectral region. They are described, for example, in Encyclopedia of Polymer Science and Engineering, 2nd Edition, A. Wiley-Interscience. They are usually used in an amount of up to 95% by weight, preferably up to 80% by weight, based on the total weight of the electroluminescent elements.

The N-alkyl-2,2'-imino-bis-(8-hydroxyquinoline)-metal complex is preferably a compound of the general formula (III)a or (III)b

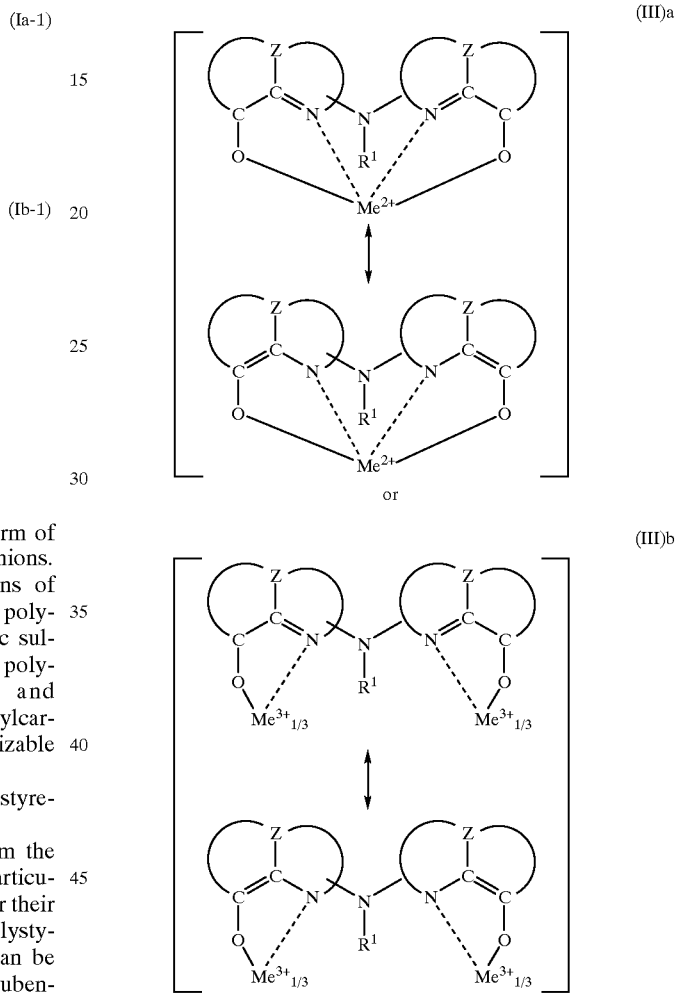

Where

Me represents a metal, $R_1$ represents hydrogen, an alkyl radical or a substituted or unsubstituted aryl radical and Z represents, independently in the two forms, atoms which complete a ring system comprising at least 2 fused rings.

In general, it is possible to use monovalent, divalent or trivalent metals which are known to form chelates.

The metal can be a monovalent, divalent or trivalent metal, for example lithium, sodium, potassium, magnesium, zinc, beryllium, calcium, aluminium, gallium, indium or a lanthanide.

Z completes a heterocyclic moiety, which comprises at least two fused rings of which one is an azole or azine ring, where further additional aliphatic or aromatic rings may be joined to the two fused rings.

The component is particularly preferably a compound of the general formula (III)c or (III)d

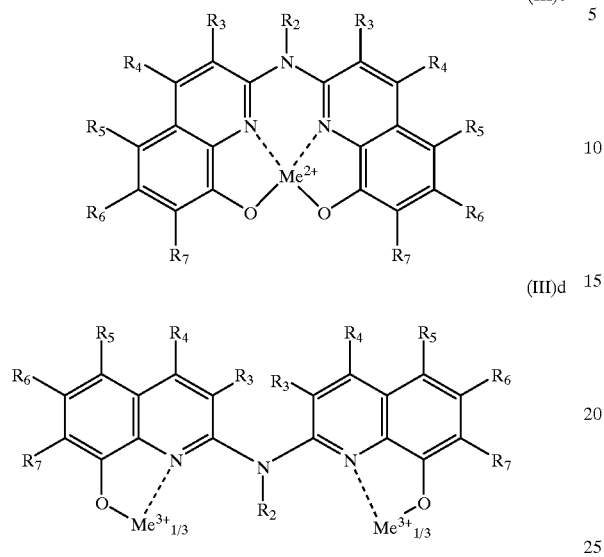

where

- R$_2$ particularly preferably represents (C$_1$–C$_{16}$)-alkyl or represents a substituted or unsubstituted aryl radical and
- R$_3$, R$_4$, R$_5$, R$_6$, R$_7$ represents, independently of one another, hydrogen, substituted or unsubstituted (C$_1$–C$_{16}$)-alkyl or acyl or halogen or substituted or unsubstituted tuted aryl or cyano or sulfonamido or a substituted or unsubstituted amino group and
- Me particularly preferably represents Zn, Mg, Al, Ga or In or Gd, Y, Sm, Er, Gd, Lu.

The component B is very particularly preferably a compound of the general formula (III)c or (III)d in which

- R$_2$ very particularly preferably represents (C$_1$–C$_{10}$)-alkyl and
- R$_3$, R$_4$, R$_5$, R$_6$ very particularly preferably represent, independently of one another, hydrogen, substituted or unsubstituted (C$_1$–C$_{10}$)-alkyl or acyl or sulfonamido and
- R$_7$ very particularly preferably represents hydrogen,
- Me very particularly preferably represents Zn, Al, Ga.

Examples which may be mentioned are:

B1
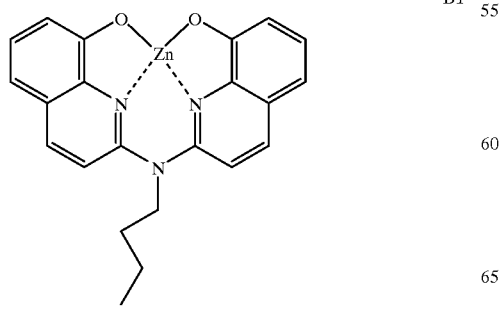

-continued

B2
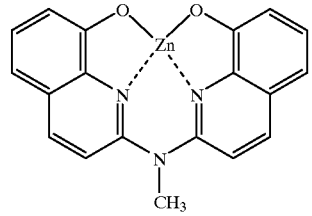

B3
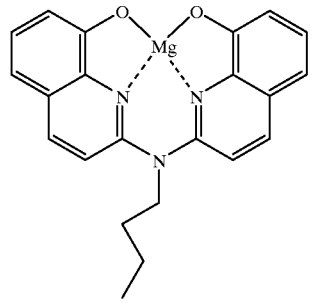

B4
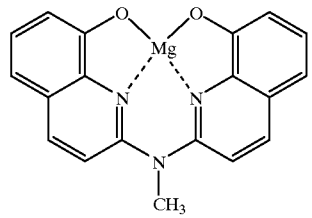

B5
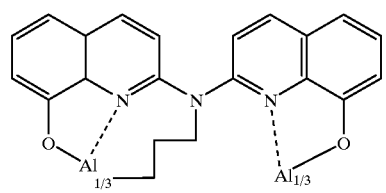

B6
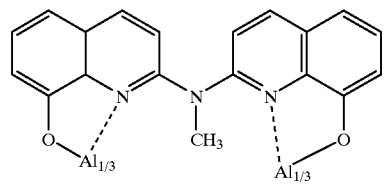

B7
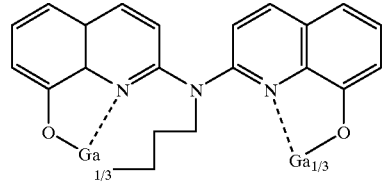

B8
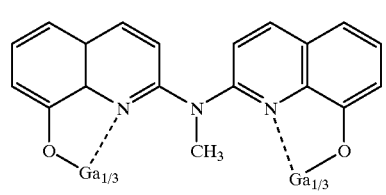

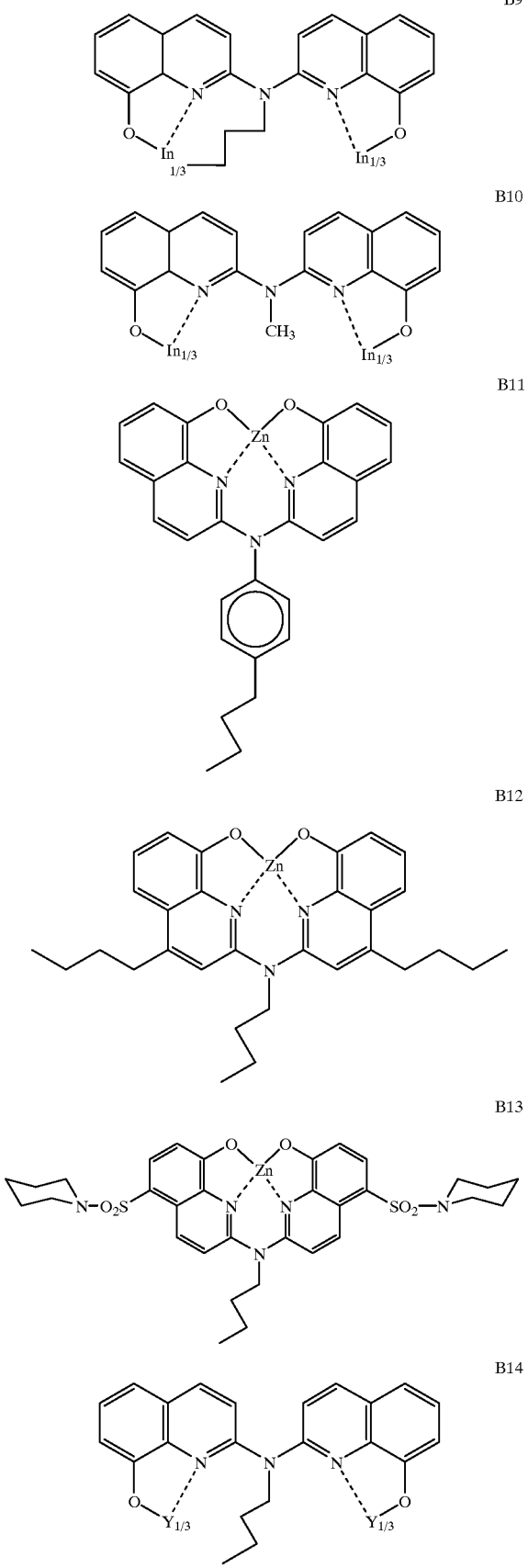

It is possible to use one or more compounds of the formulae B1 to BE15.

Some of the 8-hydroxyquinoline ligands are commercially available or they can be prepared by known methods of organic chemistry (R.G.W. Hallingshead, Vol.1, Chap.6, Butterworths, London (1954)). The metal complexes can likewise be prepared by known methods (cf., for example, U.S. Pat. No. 4,769,292).

N-alkyl-2,2'-imino-bis-(8-hydroxyquinoline) ligands have been described, for example, as reagents for the extraction and the fluorimetric determination of yttrium (A.P. Golovina et al., Zh. Anal. Khim. 37, 1816 (1982)) and also for the luminescence determination of gadolinium and europium (S.V. Kachin et al., Zh. Anal. Khim. 38, 1390 (1983)).

To produce the electroluminescent element, the N-alkyl-2,2'-imino-bis-(8-hydroxyquinoline)-metal complex and, if desired, the tertiary amino compound and the binder are dissolved in a suitable solvent and applied to a suitable substrate by casting, doctor blade coating or spin coating. However, if desired, the metal complex can also be applied as a separate layer by a vapour deposition process. The substrate can be, for example, glass or a polymer material which is provided with a transparent electrode. As polymer material, it is possible to use, for example, a film of polycarbonate, polyester such as polyethylene terephthalate or polyethylene naphthalate, polysulphone or polyimide.

Suitable transparent electrodes are a) metal oxides, e.g. indium-tinn oxide (ITO), tin oxide (NESA), zinc oxide, doped tin oxide, doped zinc oxide, etc, b) semitransparent metal films, e.g. Au, Pt, Ag, Cu etc., c) conductive polymer films such as polyanilines, polythiophenes, etc.

The metal oxide electrodes and the semitransparent metal film electrodes are applied as a thin layer by techniques such as vapour deposition, sputtering, platination, etc. The conductive polymer films are applied from solution by techniques such as spin coating, casting, doctor blade coating, etc.

The thickness of the transparent electrode is from 3 nm to several $\mu$m, preferably from 10 nm to 500 nm.

The electroluminescent layer is applied as a thin film either directly to the transparent electrode or to a charge transport layer which may be present. The thickness of the film is from 10 to 500 nm, preferably from 20 to 400 nm, particularly preferably from 50 to 250 nm.

A further charge transport layer can be inserted on the electroluminescent layer before a counterelectrode is applied.

A listing of suitable, intermediate charge transport layers, which can be hole conductor and/or electron conductor materials which may be in polymeric or low molecular weight form, if desired as a blend, is given in EP-A 0 532 798. Particularly suitable charge transport materials are specifically substituted polythiophenes which have hole transport properties. They are described, for example, in EP-A 0 686 662.

The content of low molecular weight hole conductor in a polymeric binder can be varied within the range from 2 to 97% by weight; the content is preferably from 5 to 95% by weight, particularly preferably from 10 to 90% by weight, in particular from 10 to 85% by weight. The hole injection or hole conduction zones can be deposited by various methods.

Film-forming hole conductors can also be used in pure form (100% pure). If desired, the hole injection or hole conduction zone can also contain proportions of an electroluminescent substance.

Blends consisting of only low molecular weight compounds can be vapour deposited; soluble and film-forming blends which may contain a binder in addition to low molecular weight compounds can be deposited from a solution, e.g. by means of spin coating, casting or doctor blade coating.

It is also possible to apply emitting and/or electron-conducting substances in a separate layer to the hole conductor layer containing the component A. Here, an emitting substance can also be added as dopant to the layer containing the compound A and an electron conductor substance can be additionally applied. An electroluminescent substance can also be added to the electron injection or electron conduction layer.

The content of low molecular weight electron conductors in the polymeric binder can be varied within the range from 2 to 95% by weight; the content is preferably from 5 to 90% by weight, particularly preferably from 10 to 85% by weight. Film-forming electron conductors can also be used in pure form (100% pure).

The counterelectrode comprises a conductive substance which can be transparent. Preferred conductive substances are metals, e.g. Al, Au, Ag, Mg, In, etc., or alloys and oxides of these, which can be applied by techniques such as vapour deposition, sputtering and platination.

The assembly of the invention is connected to a source of electric power by means of two electric leads (e.g. metal wires) connected to the two electrodes.

On application of a DC potential in the range from 0.1 to 100 volt, the assemblies emit light having a wavelength of from 200 to 2000 nm. They display photoluminescence in the range from 200 to 2000 nm.

The assemblies of the invention are suitable for producing units for illumination and for display of information.

EXAMPLES

Example 1

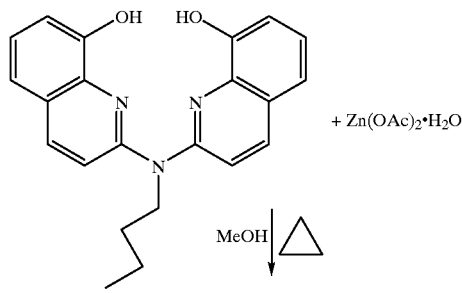

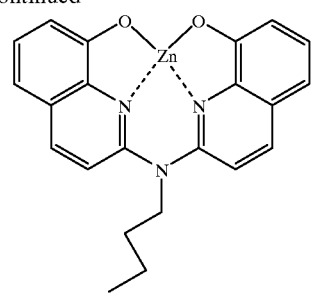

1.0 g (2.78 mmol) of N-butyl-2,2'-imino-bis-(8-hydroxyquinoline) (commercially available from Fluka Chemie AG) together with 0.61 g (2.78 mmol) of zinc acetate dihydrate are refluxed in 50 ml of methanol for 6 hours under nitrogen. The resulting yellow solid is separated off and, after washing with methanol, dried. This gives 0.94 a (2.22 mmol)≙ 79.9% of theory) of product.

| Analysis: | Zn content | theoretical | 15.46% |
|---|---|---|---|
| | | found | 15.0% |

Example 2

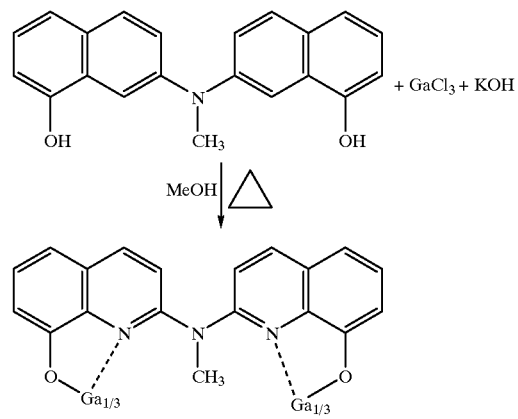

1.0 g (3.15 mmol) of N-methyl-2,2'-imino-bis-(8-hydroxyquinoline) (commercially available from Fluka Chemie AG) together with 4.11 g of a 9% strength solution of $GaCl_3$ in dry methanol and 0.354 g (6.30 mmol) of potassium hydroxide are refluxed in 60 ml of dry methanol for 6 hours under nitrogen. The resulting yellow solid is filtered off with suction, and, after washing with methanol, dried.

This gives 1.1 g (1.01 mmol≙ 32.2% of theory) of product.

| Analysis: | Ga content: | theoretical | 12.85% |
|---|---|---|---|
| | | found | 13.0% |

EXAMPLES, PHYSICAL PART

Application Example 1

The substance B1 according to the invention is used for constructing an organic light emitting diode (OLED). The OLED is produced using the following procedure:

1. Cleaning the ITO substrate

ITO-coated glass (Merck Balzers AG, FL, Part. No. 253 674 XO) is cut into 50 mm×50 mm pieces (substrates). The substrates are subsequently cleaned for 15 minutes in a 3% strength aqueous Mukasol solution in an ultrasonic bath. The substrates are then rinsed with distilled water and spun dry in a centrifuge. This rinsing and drying procedure is repeated 10 times.

2. Application of the ®Baytron P layer to the ITO

About 10 ml of the 1.3% strength polyethylenedioxythiophene/polystyrene-sulphonic acid solution (Bayer AG, Baytron P) are filtered (Millipore HV, 0.45 μm). The substrate is subsequently placed on a spin coater and the filtered solution is distributed on the ITO-coated side of the substrate. The excess solution is subsequently spun off by rotation of the plate at 500 rpm for 3 minutes. The substrate which has been coated in this way is then dried at 110° C. for 5 minutes on a hotplate. The thickness of the layer is 60 nm (Tencor, Alphastep 200).

2 Application of the hole conductor layer 5 ml of a 1.5% strength dichloroethane solution of 1 part by weight of polyvinylcarbazole (BASF, Luvican), 1 part by weight of phenylamine (Agfa Gevaert, compound A1) and 1 part by weight of phenylamine (Agfa Gevaert, compound A2) are filtered (Millipore HV, 0.45 μm) and distributed on the dried Baytron P layer. The excess solution is subsequently spun off by rotation of the plate at 800 rpm for 30 seconds. The substrate which has been coated in this way is then dried at 110° C. for 5 minutes on a hotplate. The total thickness of the layers is 150 nm.

3 Vapour deposition of the light-emitting/electron-injecting layer

A third organic layer, namely the substance B1 according to the invention, is applied by thermal vapour deposition to the two organic layers produced as described above. This is carried out in a vapour deposition unit (Leybold, Univex 350). During vapour deposition, the pressure in the vapour deposition unit is $10^{-3}$ Pa and the deposition rate is 2 Å/sec. The total thickness of the 3 organic layers is 200 nm.

4. Vapour deposition of the metal cathode

A metal electrode is vapour-deposited onto the organic layer system. For this purpose, the substrate is placed with the organic layer system facing downwards on a perforated mask (hole diameter: 5 mm). The elements Mg and Ag are vaporized in parallel from two vaporization boats at a pressure of $10^{-3}$ Pa. The vapour deposition rate was 28 Å Å/sec for Mg. The thickness of the vapour-deposited metal contents was 500 nm.

The two electrodes of the organic LED are connected via electric leads to a power source. The positive pole is connected to the ITO electrode and the negative pole is connected to the MgAg electrode.

Above a voltage of only 3 volt, electroluminescence can be detected by means of a photodiode (EG&G C30809E). At a voltage of 8 volt, the current per unit area is 1 mA/cm² and the electroluminescence is readily visible. The colour of the electroluminescence is greenish blue.

Application Example 2

The substance B4 according to the invention is used for constructing an organic light emitting diode (OLED).

The procedure for production and for electric actuation is as described in Example 1, except that, as third organic layer, the substance B4 according to the invention is applied by thermal vapour deposition to the first two layers. This is carried out in a vapour deposition unit (Leybold, Univex 350). During vapour deposition, the pressure in the vapour deposition unit is $10^{31\ 3}$ Pa and the deposition rate is 2 Å/sec. The total thickness of the 3 organic layers is 200 nm.

Above a voltage of only 3 volt, electroluminescence can be detected by means of a photodiode (EG&G C30809E). At a voltage of 8 volt, the current per unit area is 1 mA/cm² and the electroluminescence is totally visible. The colour of the electroluminescence is greenish blue.

Application Example 3

The substance B8 according to the invention is used for constructing an organic light emitting diode (OLED).

The procedure for production and for electric actuation is as described in Example 1, except that, as third organic layer, the substance B8 according to the invention is applied by thermal vapour deposition to the first two layers. This is carried out in a vapour deposition unit (Leybold, Univex 350). During vapour deposition, the pressure in the vapour deposition unit is $10^{-3}$ Pa and the deposition rate is 2 Å/sec. The total thickness of the 3 organic layers is 200 nm.

Above a voltage of only 4.5 volt, electroluminescence can be detected by means of a photodiode (EG&G C30809E). At a voltage of 12 volt, the current per unit area is 1 mA/cm² and the electroluminescence is totally visible. The colour of the electroluminescence is greenish blue.

What is claimed is:

1. An electroluminescent assembly comprising a substrate, an anode, an electroluminescent element, and a cathode, wherein (1) at least one of the anode and/or cathode is transparent in the visible spectral region, and (2) the electroluminescent element contains an N-alkyl-2,2'-imino-bis(8-hydroxy-quinoline)-metal complex and consists of one or more zones selected from the group consisting of a hole injection zone, a hole transport zone, an electroluminescent zone, an electron transport zone, and an electron injection zone arranged in the order listed, with the proviso that each said zone can optionally assume functions of other such zones such that the electroluminescent element as a whole exhibits hole-injecting, hole-transporting, electroluminescent, electron-transporting, and electron-injecting functions, wherein the hole injection zone must be present and contains.

(i) an uncharged or cationic polythiophene having the formula (I)

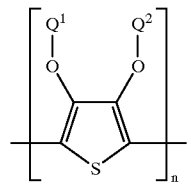

wherein $Q^1$ and $Q^2$ independently represent hydrogen or substituted or unsubstituted $(C_1–C_{20})$-alkyl, $CH_2OH$, or $(C_6–C_{14})$-aryl or $Q^1$ and $Q^2$ together represent —$(CH_2)_m$—$CH_2$—, wherein m is 0 to 12, or $(C_6–C_{14})$-arylene, and n represents an integer from 2 to 10,000, or (ii) one or more uncharged or cationic polythiophenes of the formulas (Ia) and/or (Ib)

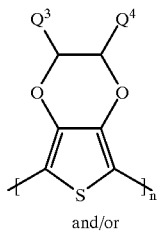

(Ia)

and/or

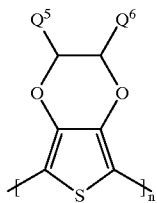

(Ib)

wherein
Q$^3$ and Q$^4$ independently represent hydrogen or a substituted or unsubstituted (C$_1$–C$_{18}$)-alkyl, (C$_2$–C$_{12}$)-alkenyl, (C$_3$–C$_7$)-cycloalkyl, (C$_7$–C$_{15}$)-aralkyl, (C$_6$–C$_{10}$)-aryl, (C$_1$–C$_{18}$)-alkyloxy, or (C$_2$–C$_{18}$)-alkyloxy ester group, Q$^5$ and Q$^6$ independently represent hydrogen or a (C$_1$–C$_{18}$)-alkyl, (C$_2$–C$_{12}$)-alkenyl, (C$_3$–C$_7$)-cycloalkyl, (C$_7$–C$_{15}$)-aralkyl, (C$_6$–C$_{10}$)-aryl, (C$_1$–C$_8$)-alkoxy, or (C$_2$–C$_8$)-alkyloxy ester group substituted by at least one sulphonate group, with the proviso that Q$^5$ and Q$^6$ cannot both be hydrogen, and n represents an integer from 2 to 10,000.

2. An electroluminescent assembly according to claim 1 wherein the hole injection zone contains one or more uncharged or cationic polythiophenes of the formulas (Ia-1) and/or (Ib-1)

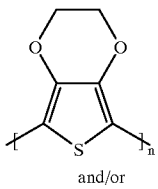

(Ia-1)

and/or

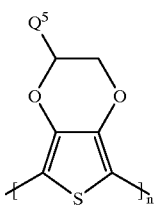

(Ib-1)

wherein
Q$^5$ represents a (C$_1$–C$_{18}$)-alkyl, (C$_2$–C$_{12}$)-alkenyl, (C$_3$–C$_7$)-cycloalkyl, (C$_7$–C$_{15}$)-aralkyl, (C$_6$–C$_{10}$)-aryl, (C$_1$–C$_{18}$)-alkoxy, or (C$_2$–C$_{18}$)-alkyloxy ester group substituted by at least one sulphonate group, and n represents an integer from 2 to 10,000.

3. An electroluminescent assembly according to claim 1 additionally comprising polyanions selected from the group consisting of polymeric carboxylic acids, polymeric sulphonic acids, and mixtures thereof in the hole injection zone.

4. An electroluminescent assembly according to claim 1 additionally comprising counterions selected from the group consisting of polystyrene sulphonic acids, alkaline earth metal salts, and mixtures thereof in the hole injection zone.

5. An electroluminescent assembly according to claim 1 wherein the hole injection zone and/or the hole transport zone contains an aromatic tertiary amino compound having the formula (II)

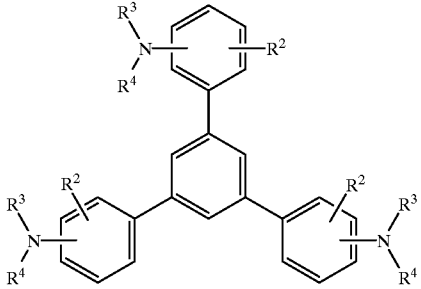

(II)

wherein
R$^2$ represents hydrogen, substituted or unsubstituted alkyl, or halogen, and
R$^3$ and R$^4$ independently represent substituted or unsubstituted (C$_1$–C$_{10}$)-alkyl, alkoxycarbonyl-substituted (C$_1$–C$_{10}$)-alkyl, or substituted or unsubstituted aryl, aralkyl, or cycloalkyl.

6. An electroluminescent assembly according to claim 1 wherein the hole injection zone and/or the hole transport zone contains an aromatic tertiary amino compound having the formula (II)

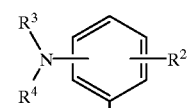

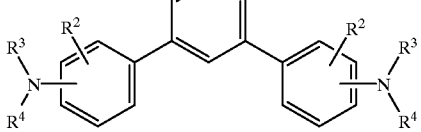

(II)

wherein
R$^2$ represents hydrogen or (C$_1$–C$_6$)-alkyl, and
R$^3$ and R$^4$ independently represent (C$_1$–C$_6$)-alkyl, (C$_1$–C$_4$)-alkoxycarbonyl-(C$_1$–C$_6$)-alkyl, unsubstituted phenyl, naphthyl, phenyl-(C$_1$–C$_4$)-alkyl, naphthyl-(C$_1$–C$_4$)-alkyl, alkyl, cyclopentyl, or cyclohexyl, (C$_1$–C$_4$)-alkyl-substituted phenyl, naphthyl, phenyl-(C$_1$–C$_4$)-alkyl, naphthyl-(C$_1$–C$_4$)-alkyl, cyclopentyl, or cyclohexyl, or (C$_1$–C$_4$)-alkoxy-substituted phenyl, naphthyl, phenyl-(C$_1$–C$_4$)-alkyl, naphthyl-(C$_1$–C$_4$)-alkyl, cyclopentyl, or cyclohexyl.

7. An electroluminescent assembly according to claim 1 wherein the hole injection zone and/or the hole transport zone contains one or more aromatic tertiary amino compounds selected from the group consisting of compounds having the formulas

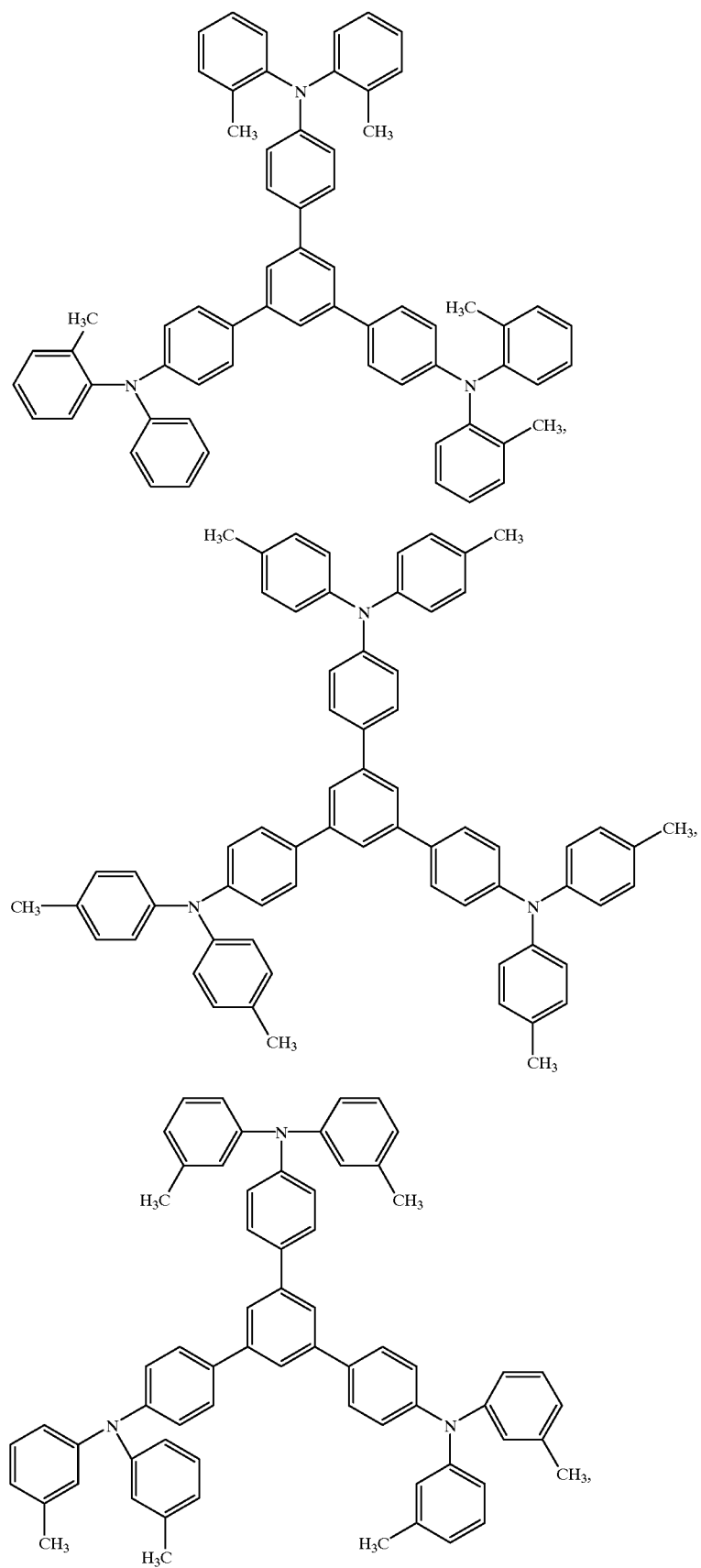

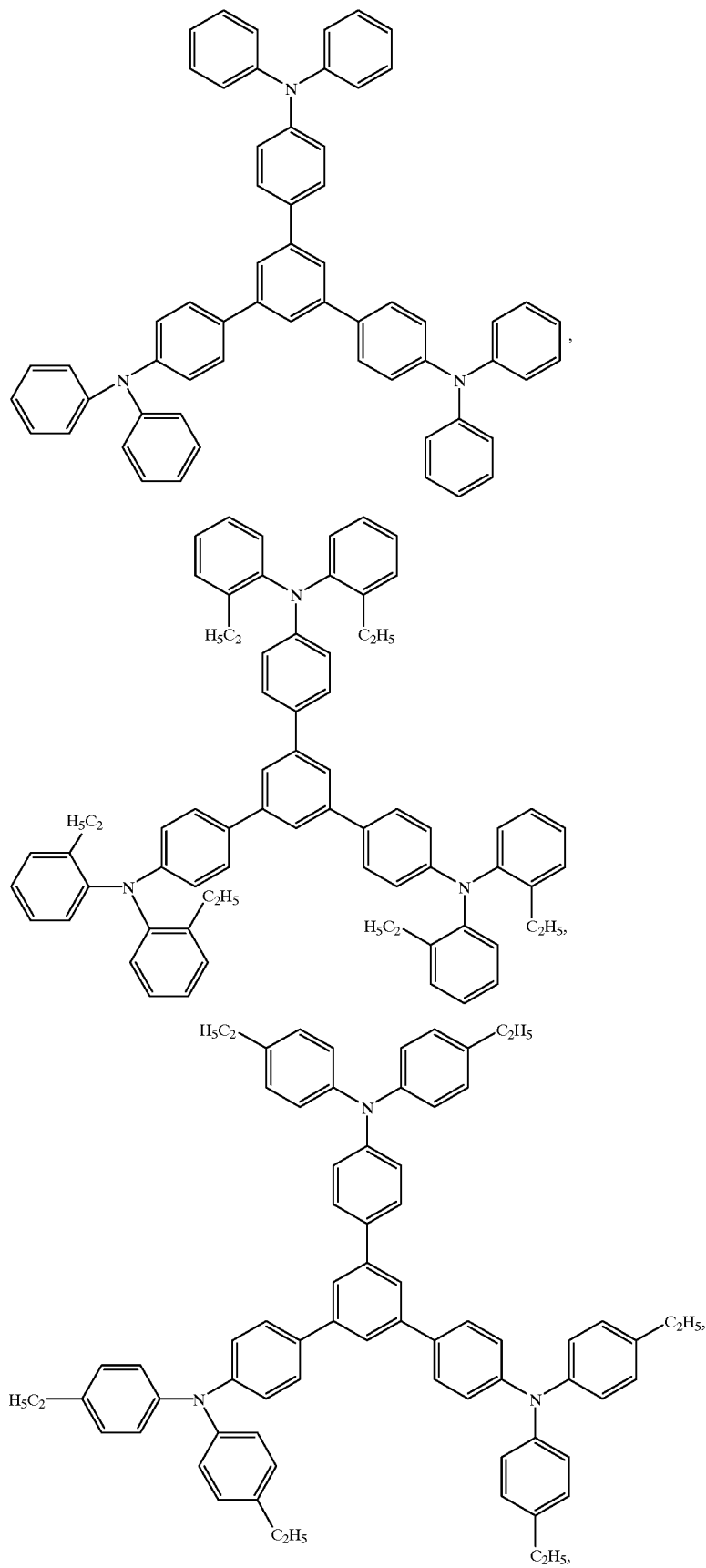

-continued
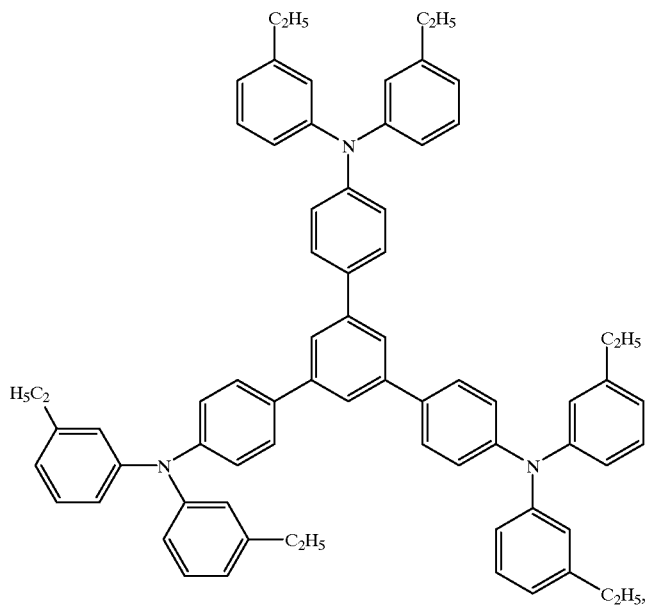
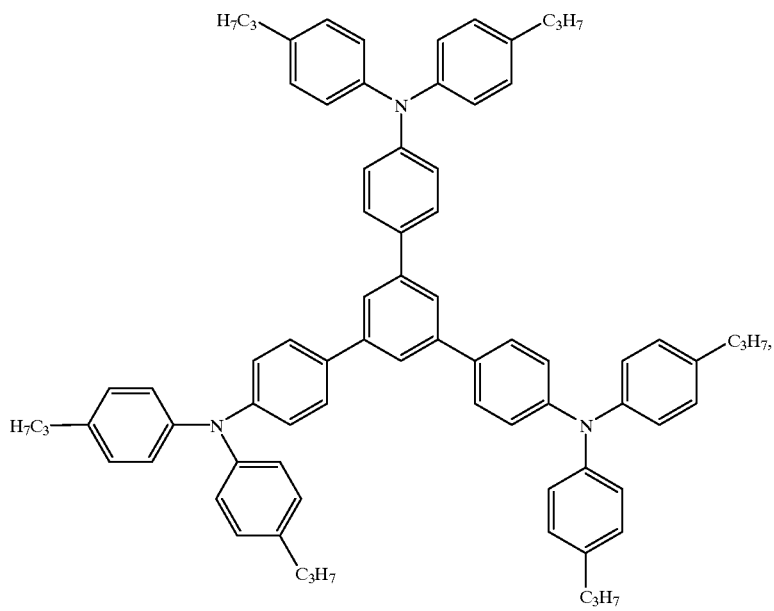

-continued
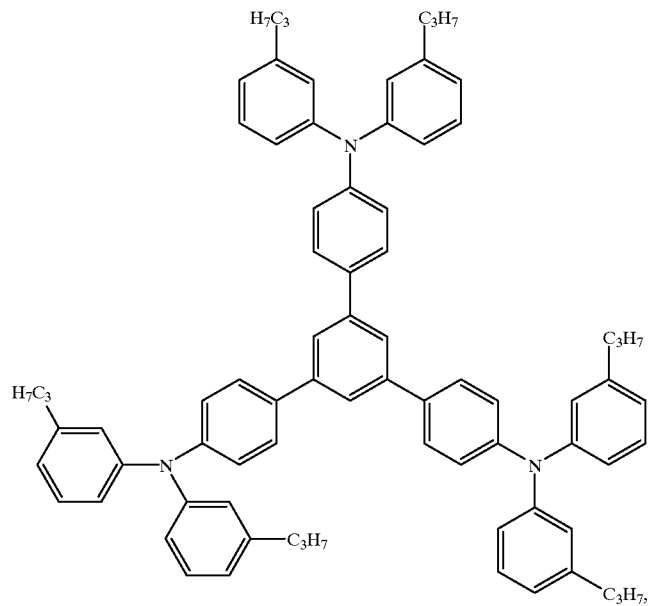
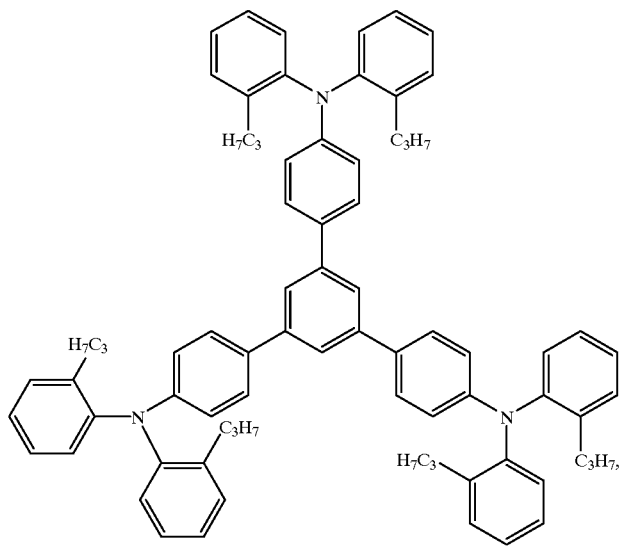

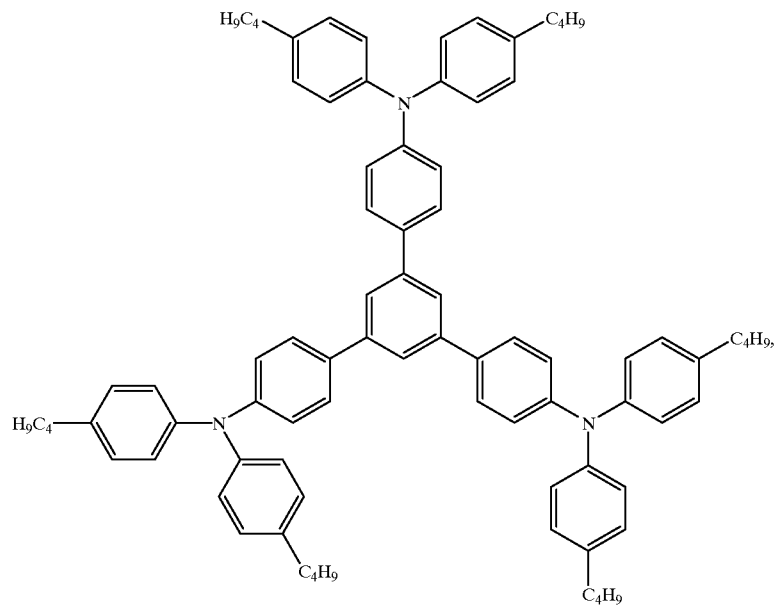
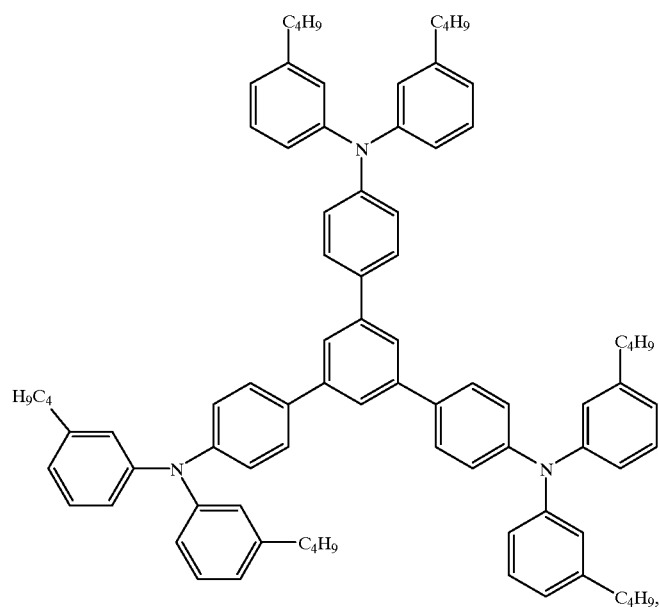

-continued
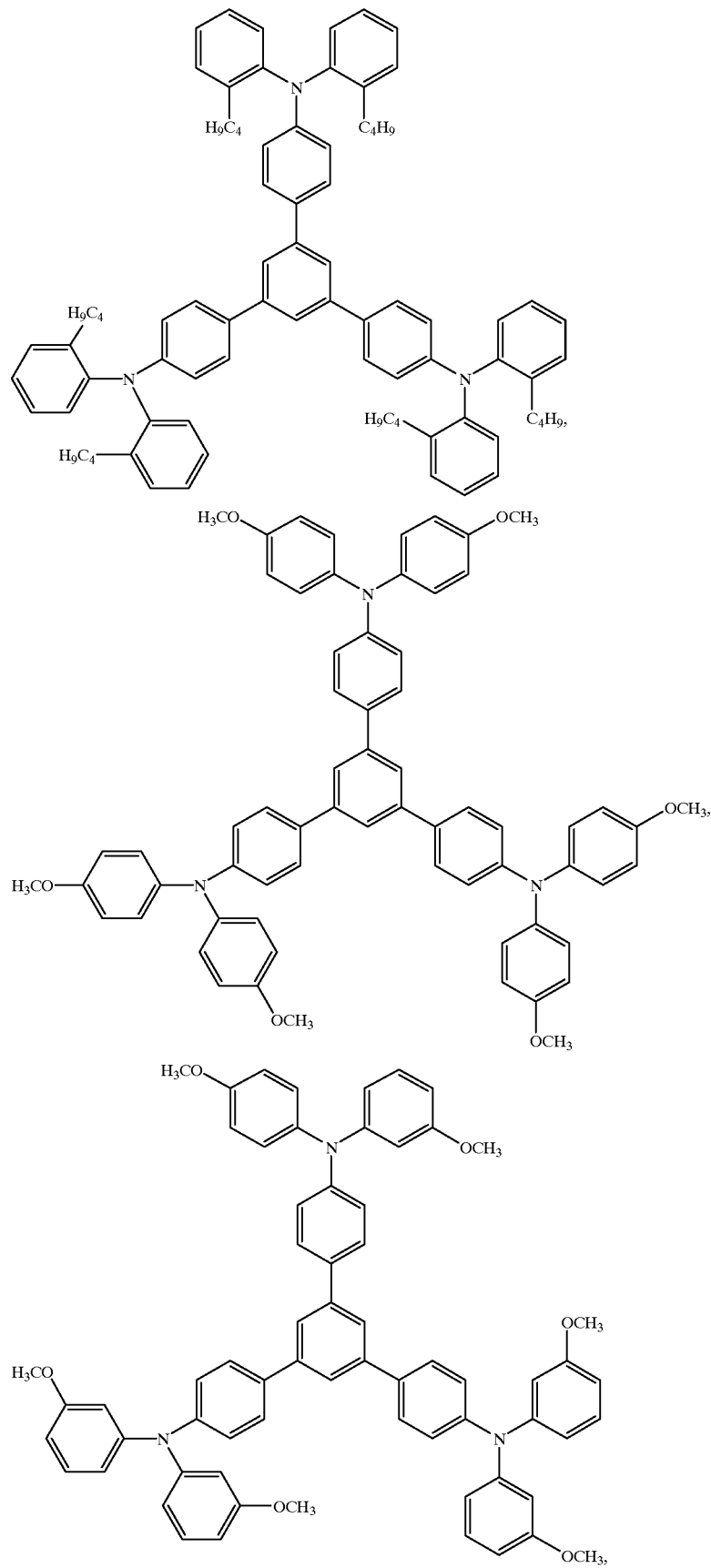

-continued
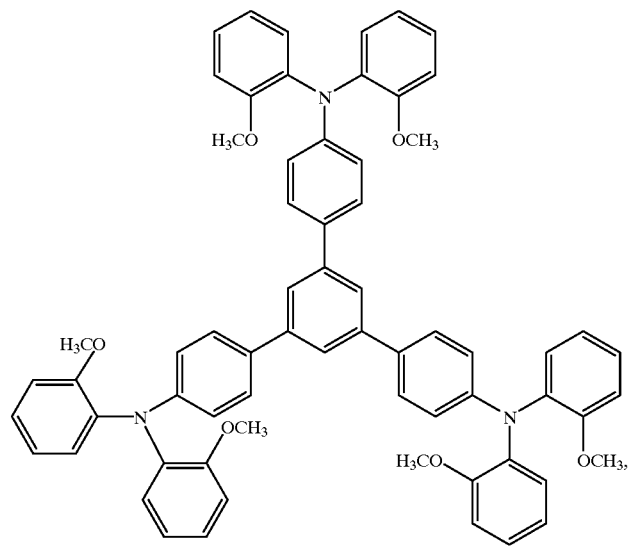
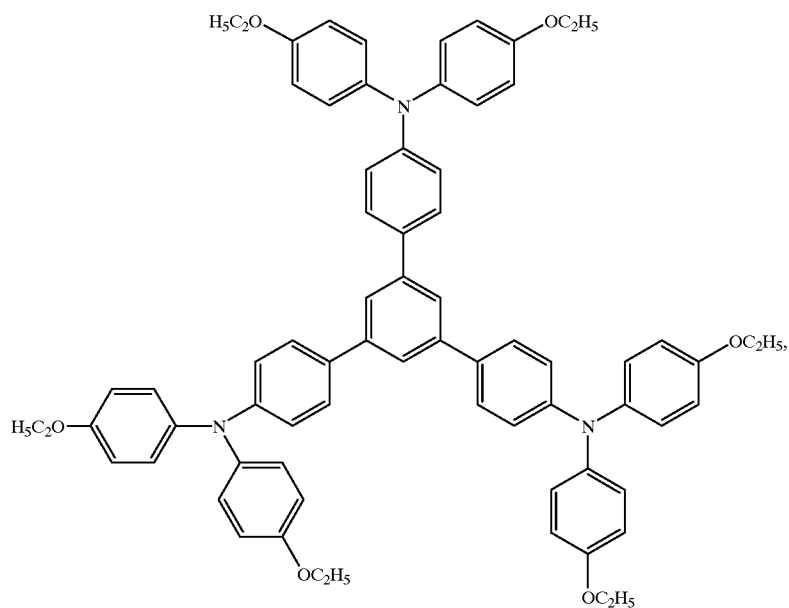

-continued
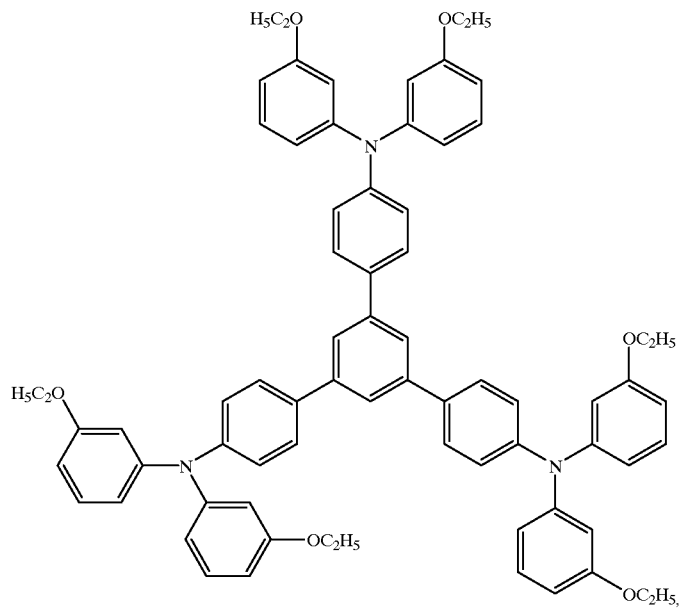
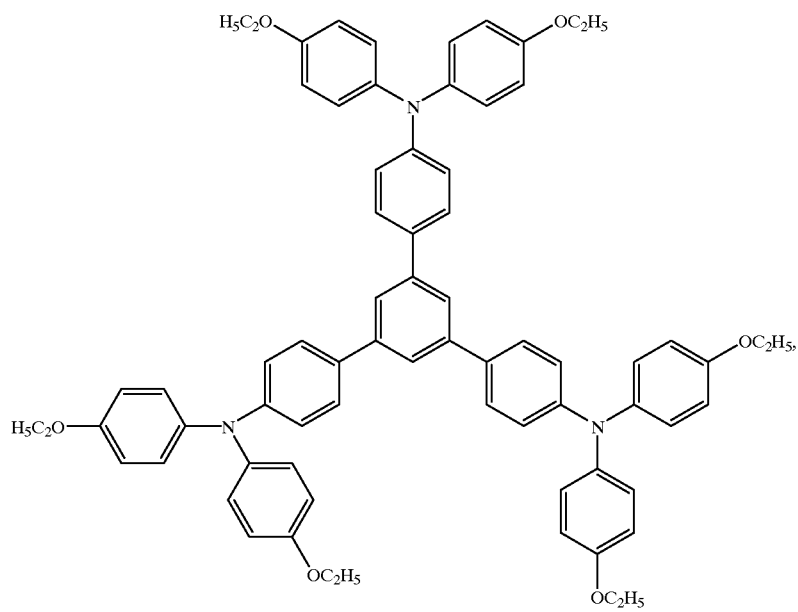

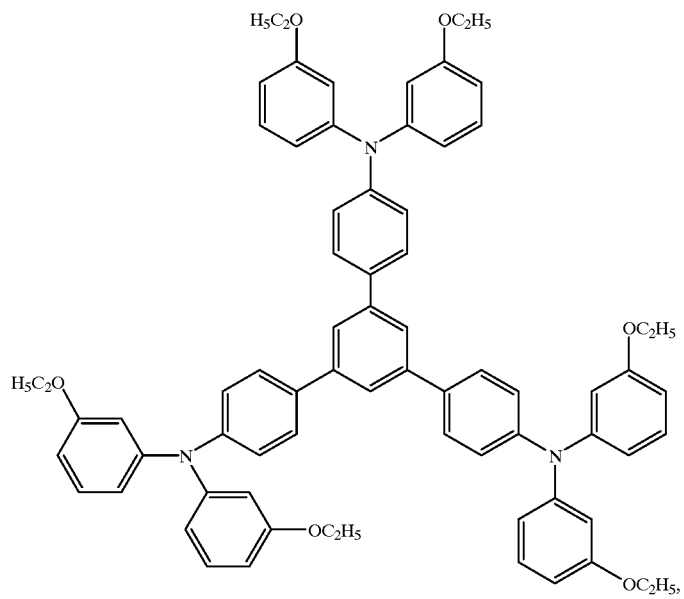
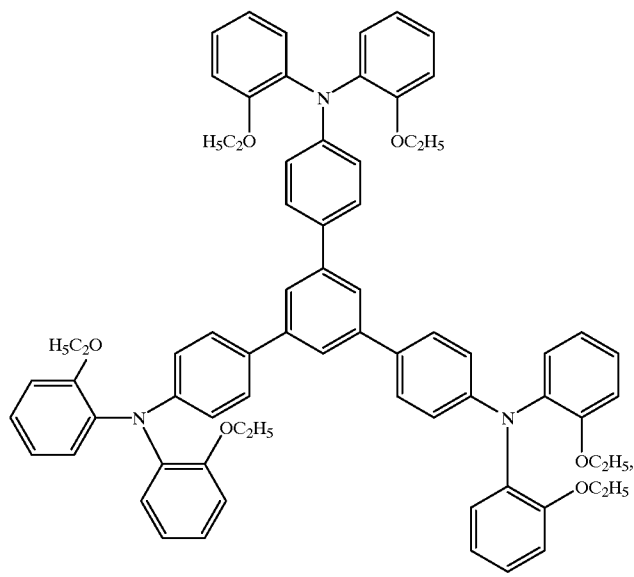

-continued
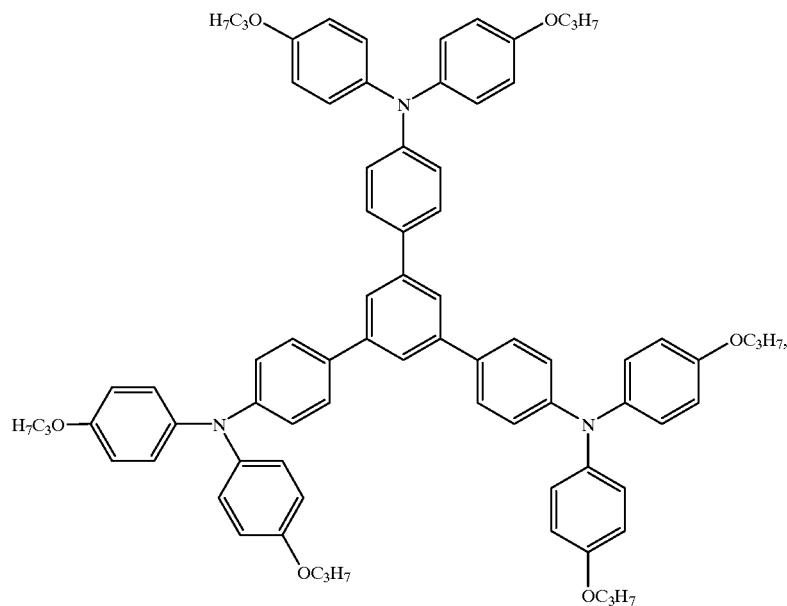
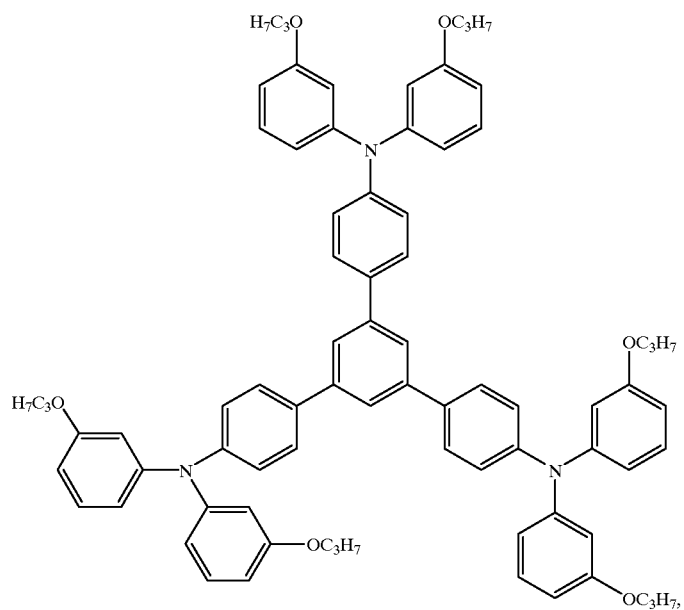

-continued
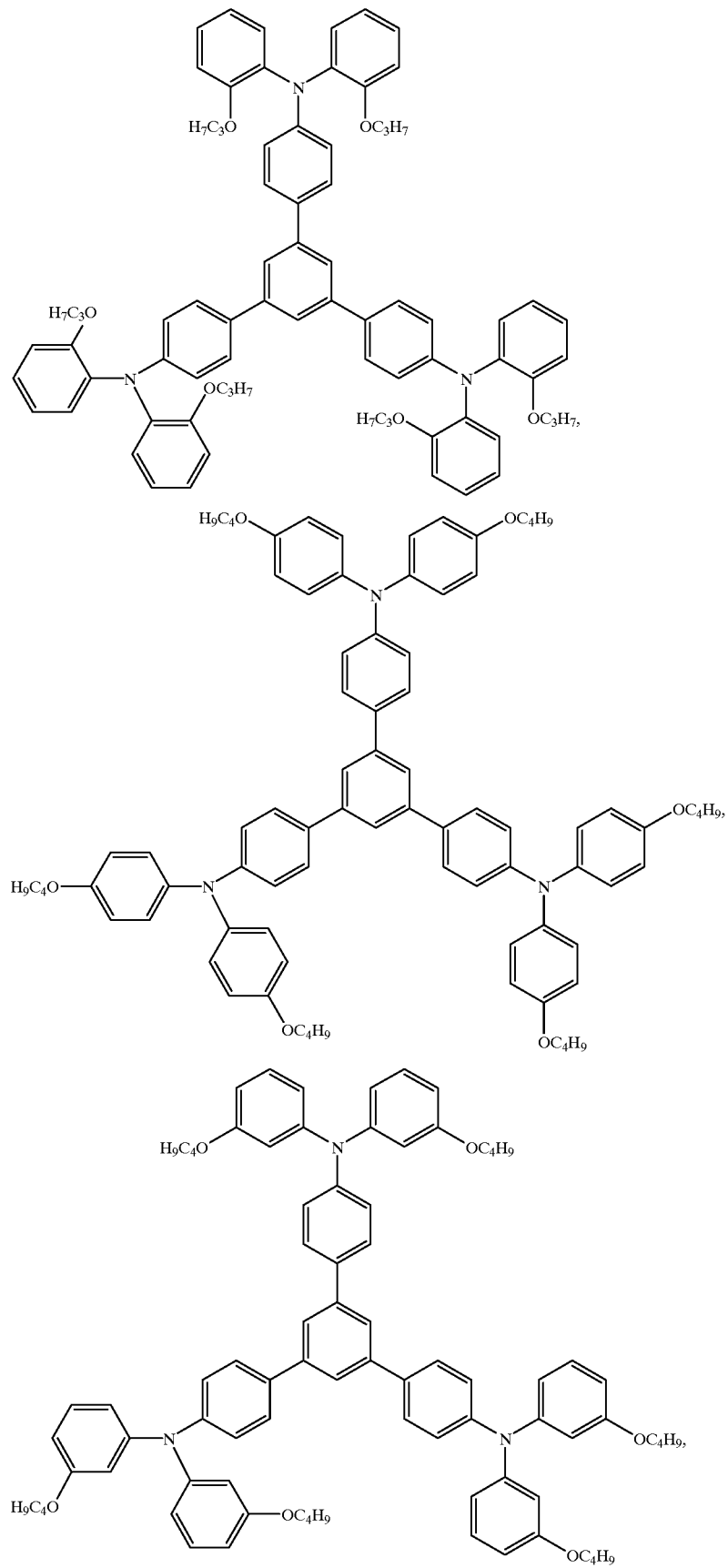

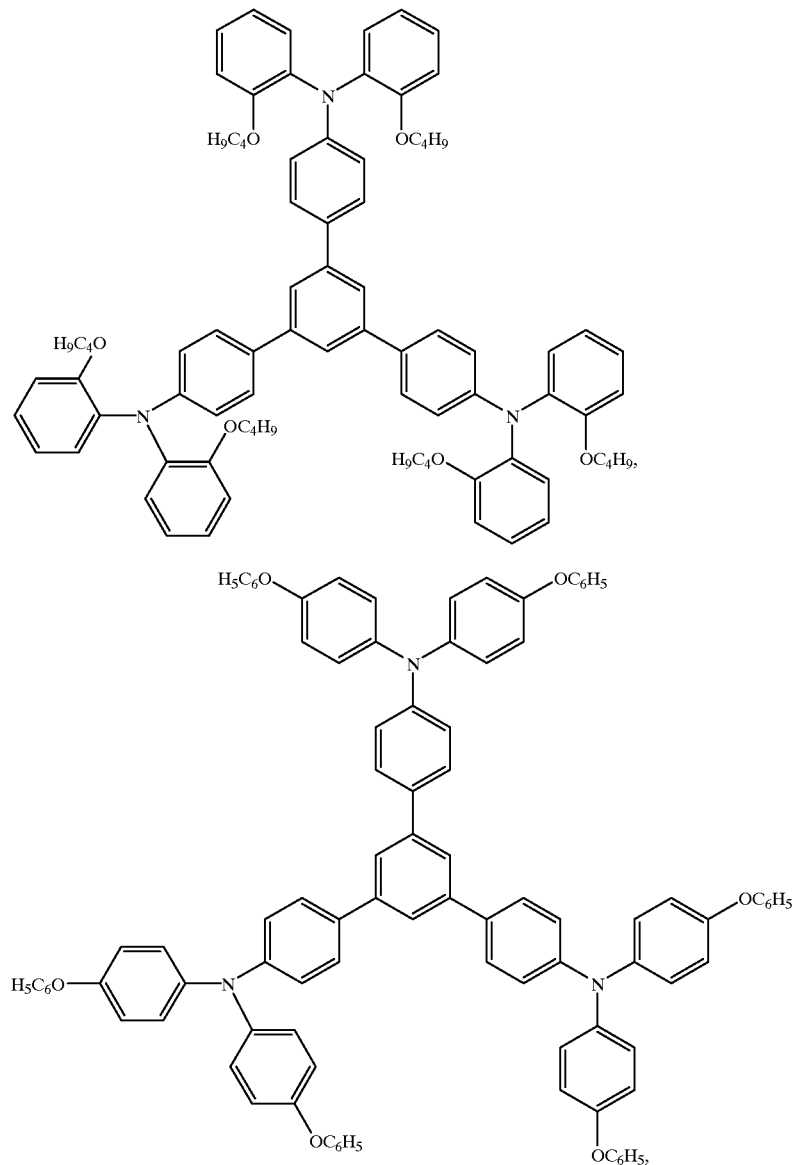

-continued
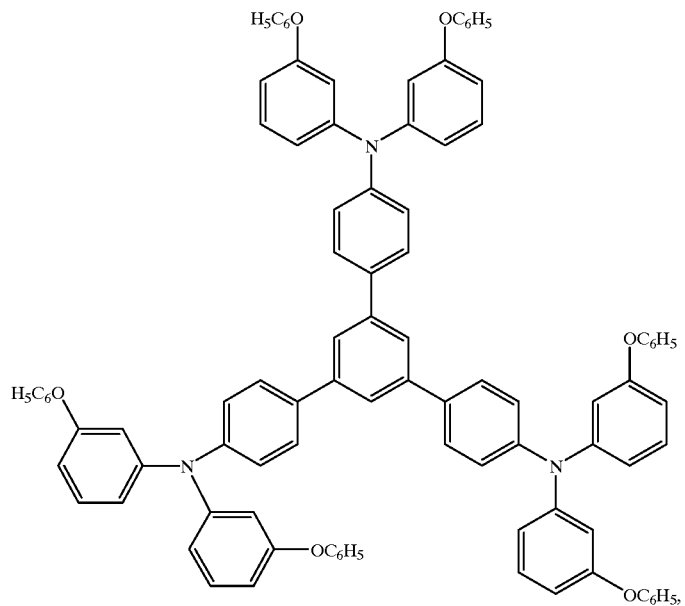
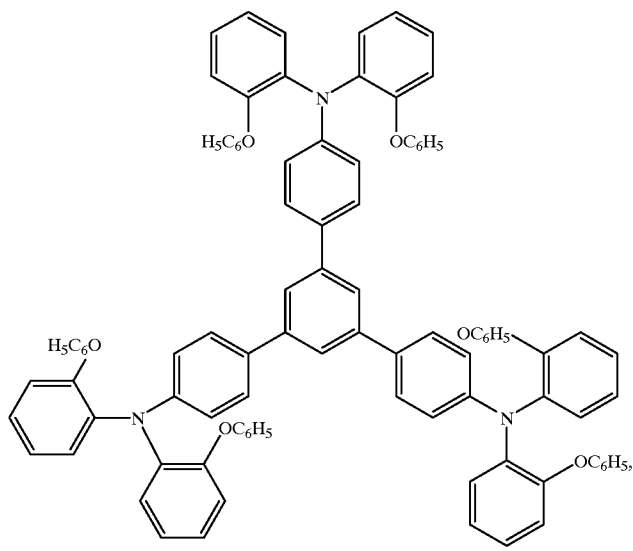

-continued
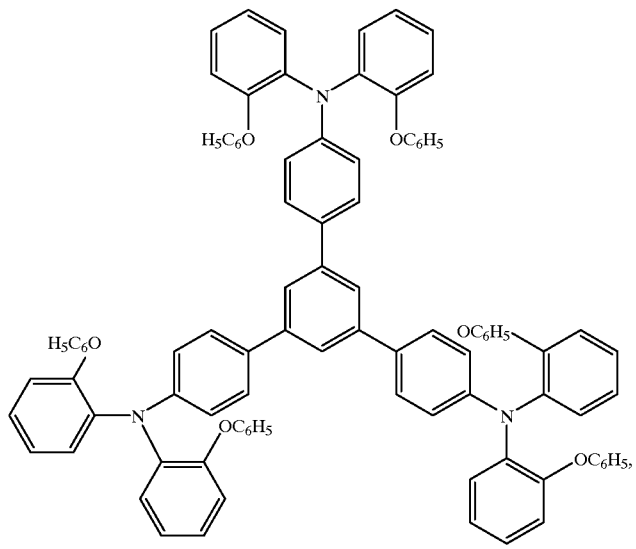
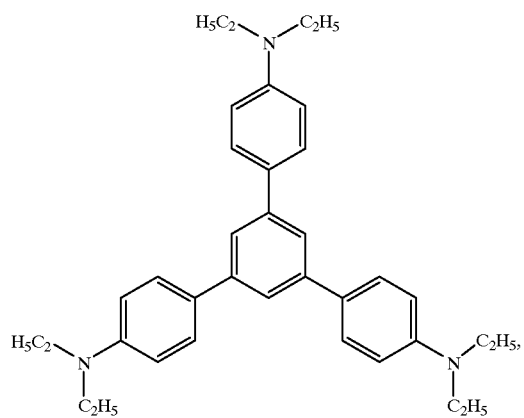
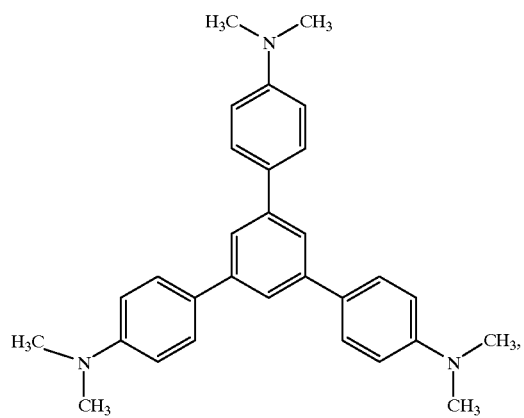

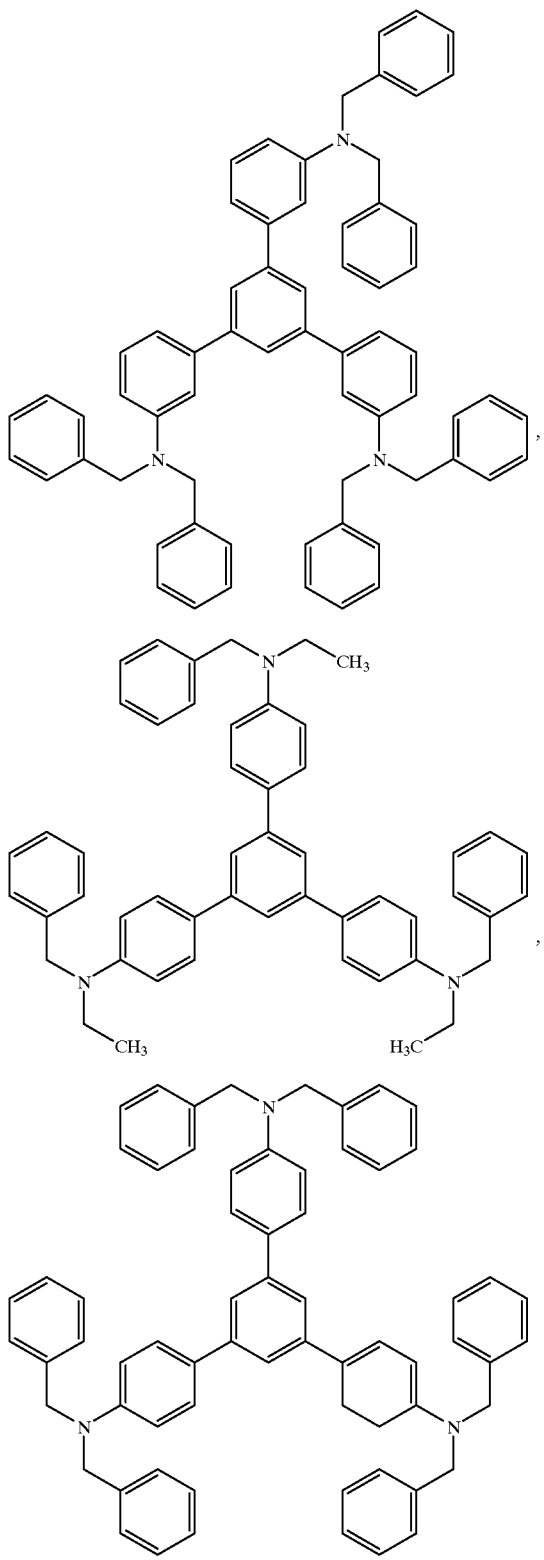
and

-continued

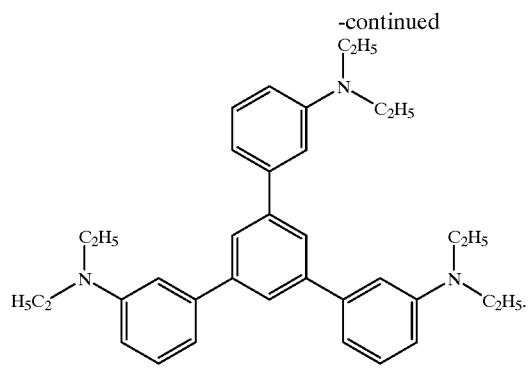

8. An electroluminescent assembly according to claim 1 wherein the N-alkyl-2,2'-imino-bis(8-hydroxyquinoline)-metal complex is a compound having the formula (III)a or (III)b

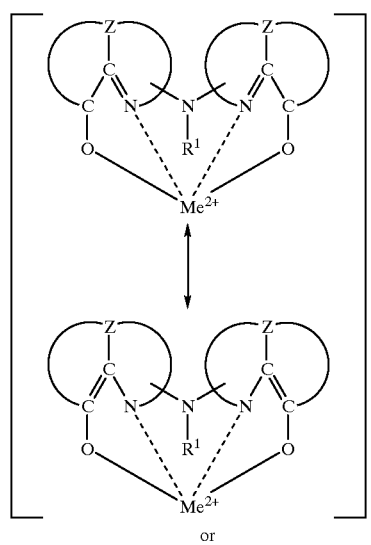

(III)a

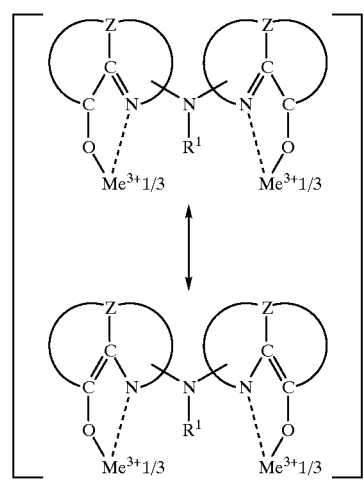

(III)b wherein

Me represents a metal,

R$^1$ represents hydrogen, an alkyl radical, or a substituted or unsubstituted aryl radical, and Z represents, independently in each formula, atoms that complete a ring system having at least two fused rings.

9. An electroluminescent assembly according to claim 8 wherein Me is a monovalent, divalent, or trivalent metal that forms chelates.

10. An electroluminescent assembly according to claim 1 additionally containing one or more transparent binders selected from the group consisting of polycarbonates, polyester carbonates, copolymers of styrene, polysulphones, polymers based on vinyl-containing monomers, polyolefins, cyclic olefin copolymers, and phenoxy resins.

11. An electroluminescent assembly according to claim 1 wherein the N-alkyl-2,2'-imino-bis(8-hydroxyquinoline)-metal complex is selected from the group consisting of compounds having the formulas

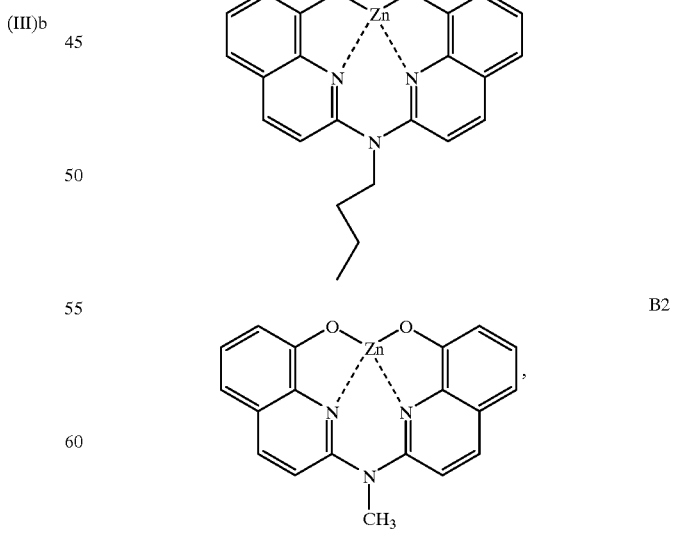

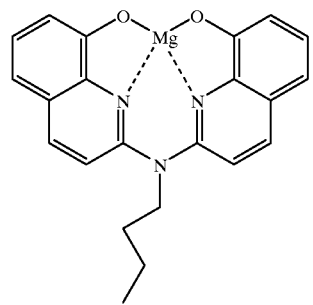
B3
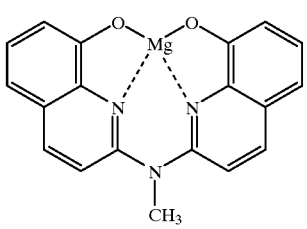
B4
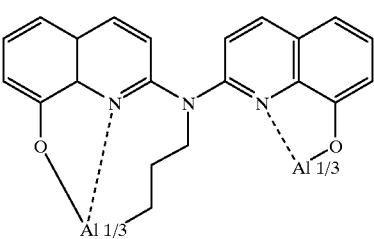
B
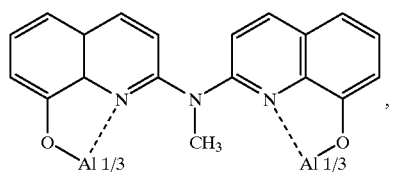
B
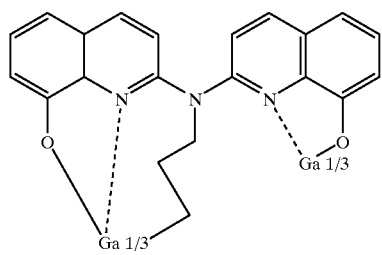
B7
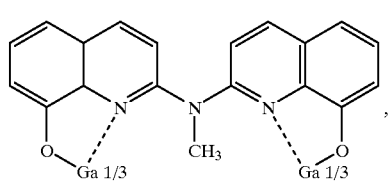
B8
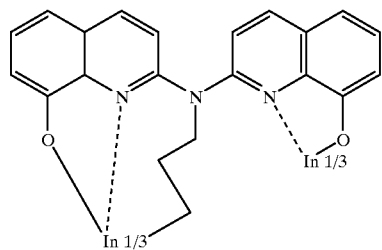
B9
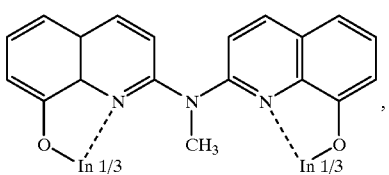
B10
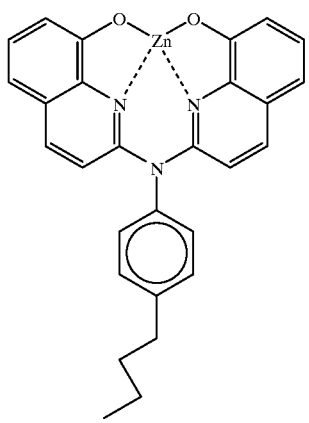
B11
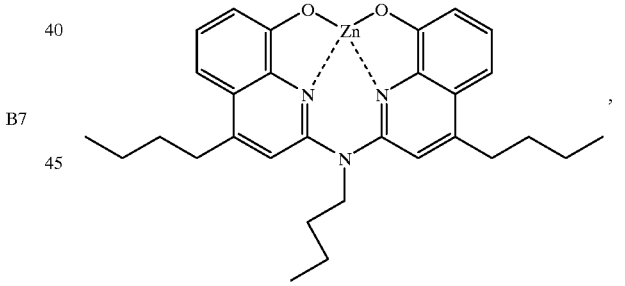
B12
B13

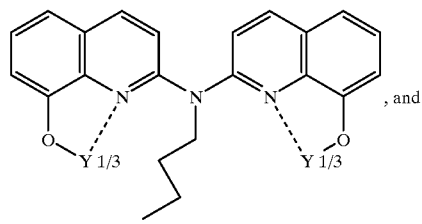
B14
, and
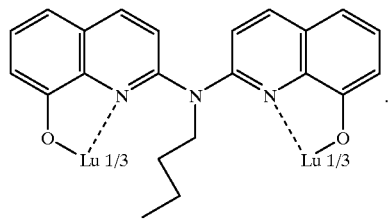
B15
* * * * *